(12) United States Patent
Watanabe

(10) Patent No.: US 11,106,087 B2
(45) Date of Patent: Aug. 31, 2021

(54) LIGHTING DEVICE HAVING LIGHT SOURCES ARRANGED IN COLUMNS AND DISPLAY DEVICE THEREOF

(71) Applicant: SHARP KABUSHIKI KAISHA, Sakai (JP)

(72) Inventor: Hisashi Watanabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 16 days.

(21) Appl. No.: 16/620,634

(22) PCT Filed: Jun. 8, 2018

(86) PCT No.: PCT/JP2018/021980
§ 371 (c)(1),
(2) Date: Dec. 9, 2019

(87) PCT Pub. No.: WO2018/230454
PCT Pub. Date: Dec. 20, 2018

(65) Prior Publication Data
US 2021/0132444 A1 May 6, 2021

(30) Foreign Application Priority Data

Jun. 15, 2017 (JP) .............................. JP2017-117550

(51) Int. Cl.
*G02F 1/1335* (2006.01)
*H01L 25/075* (2006.01)
*G02F 1/13357* (2006.01)

(52) U.S. Cl.
CPC .. *G02F 1/133612* (2021.01); *G02F 1/133603* (2013.01); *G02F 1/133608* (2013.01); *H01L 25/0753* (2013.01); *G02F 2201/42* (2013.01); *G02F 2201/56* (2013.01)

(58) Field of Classification Search
CPC ......... G02F 1/133612; G02F 1/133603; G02F 1/133608; H01L 25/0753
See application file for complete search history.

(56) References Cited

U.S. PATENT DOCUMENTS

| 6,559,879 B1 * | 5/2003 | Kobayashi | ................. B41J 2/45 |
| | | | 347/238 |
| 2011/0281489 A1 | 11/2011 | Tannas, Jr. | |
| 2013/0069560 A1 | 3/2013 | Kurita | |
| 2019/0305204 A1 * | 10/2019 | Watanabe | .............. H05B 45/00 |
| 2021/0056891 A1 * | 2/2021 | Wei | ..................... H01L 25/0753 |

FOREIGN PATENT DOCUMENTS

| JP | 2009-181883 A | 8/2009 |
| JP | 2013-080696 A | 5/2013 |
| JP | 2013-532304 A | 8/2013 |

OTHER PUBLICATIONS

Tsuchiya, JP2009-181883, machine translation, Aug. 2009 (Year: 2009).*

* cited by examiner

*Primary Examiner* — Tracie Y Green
(74) *Attorney, Agent, or Firm* — ScienBiziP, P.C.

(57) ABSTRACT

A plurality of LEDs (light sources) 16 that are arranged to form a column, each of which includes a electrode 20 for power supply, a plurality of first wires 21 that are connected to the electrode 20 in the plurality of LEDs 16, and a second wire 22 that is connected with each of the plurality of first wires 21 and is pulled out toward one end side in an array direction of the plurality of LEDs 16 are included.

5 Claims, 19 Drawing Sheets

FIG. 1
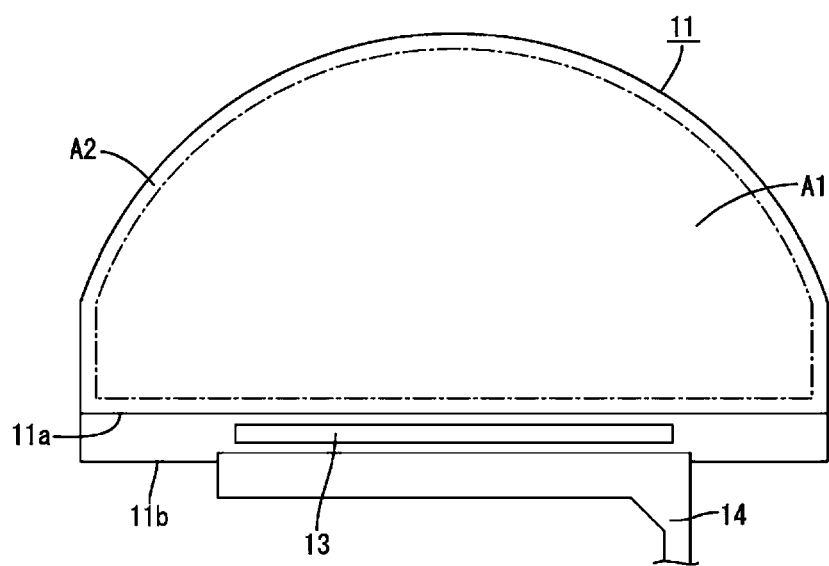
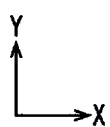

LIGHTING DEVICE HAVING LIGHT SOURCES ARRANGED IN COLUMNS AND DISPLAY DEVICE THEREOF

TECHNICAL FIELD

The present invention relates to a lighting device and a display device.

BACKGROUND ART

As an example of a method of resizing a liquid crystal display that is provided in a conventional liquid crystal display device, one that is described in PTL 1 described below has been known. As the method of resizing the liquid crystal display, PTL 1 describes a method that includes a step of identifying a cut line along each of front surface and back surface plates and identifying a target portion and a waste portion of the liquid crystal display, a step of separating the liquid crystal display along the cut line so as to separate the liquid crystal display into the target portion and the waste portion and thereby generating, along the target portion, an exposed edge that is open to a region between the plates of the target portion, a step of pressing the plates of the target portion toward each other and leaving a space between the plates by an amount of a predetermined cell gap, a step of applying an adhesive along the exposed edge, and a step of removing an electrical short circuit at the exposed edge of the target portion.

CITATION LIST

Patent Literature

PTL 1: Japanese Unexamined Patent Application Publication (Translation of PCT Application) No. 2013-532304

Technical Problem

Although, PTL 1 described above describes the method of resizing the liquid crystal display, but does not disclose a method of resizing a backlight device that radiates light for display to the liquid crystal display. In a case where the liquid crystal display is resized, it is necessary to newly design a backlight device suitable for a size of the liquid crystal display, resulting in high cost.

SUMMARY OF INVENTION

The invention is accomplished in the aforementioned circumstances and aims to achieve cost reduction.

Solution to Problem

A lighting device of the invention includes: a plurality of light sources that are arranged to form a column, each of which includes an electrode for power supply; a plurality of first wires that are connected to the electrode in the plurality of light sources; and a second wire that is connected with each of the plurality of first wires and is pulled out toward one end side in an array direction of the plurality of light sources.

In this manner, the plurality of light sources are lit by supplying power, which is transmitted through the second wire, to the electrodes via the plurality of first wires. The second wire that is connected to each of the plurality of first wires is pulled out toward the one end side in the array direction of the plurality of light sources. Accordingly, even in a case where, from among the plurality of light sources that are arranged to form a column, a light source that is disposed on the other end side in the array direction is removed together with a first wire, by the second wire that is pulled out toward the one end side in the array direction, power supply is maintained in a first wire, which is connected to an electrode of a light source which is remained without being removed. This makes it possible to easily change an external shape of the lighting device by removing the light source and the like as above after the lighting device is manufactured, thus resulting in a suitable configuration to achieve cost reduction as compared to a case where the number of light sources to be arranged, arrangement thereof, and the like are assumed to be individually designed in accordance with a change in an external shape of the lighting device. Moreover, even in a case where failure or the like occurs in any of the plurality of light sources, since the second wire is connected to each of the plurality of first wires so that power supply to the plurality of light sources is individually performed, power supply to a light source in which failure or the like does not occur is maintained.

Advantageous Effects of Invention

According to the present invention, it is possible to achieve cost reduction.

BRIEF DESCRIPTION OF DRAWINGS

FIG. 1 is a schematic plan view of a liquid crystal panel that constitutes a liquid crystal display device according to Embodiment 1 of the invention.

DESCRIPTION OF EMBODIMENTS

Embodiment 1

Embodiment 1 of the invention will be described with reference to FIG. 1 to FIG. 9. A liquid crystal display device (display device) 10 is exemplified in the present embodiment. Note that, an X-axis, a Y-axis, and a Z-axis are illustrated in a part of each figure, and are drawn so that each of directions of the axes is a direction illustrated in each figure. Moreover, an upper side of FIG. 2 is set as a front side and a lower side of the figure is set as a back side.

Figure 2:
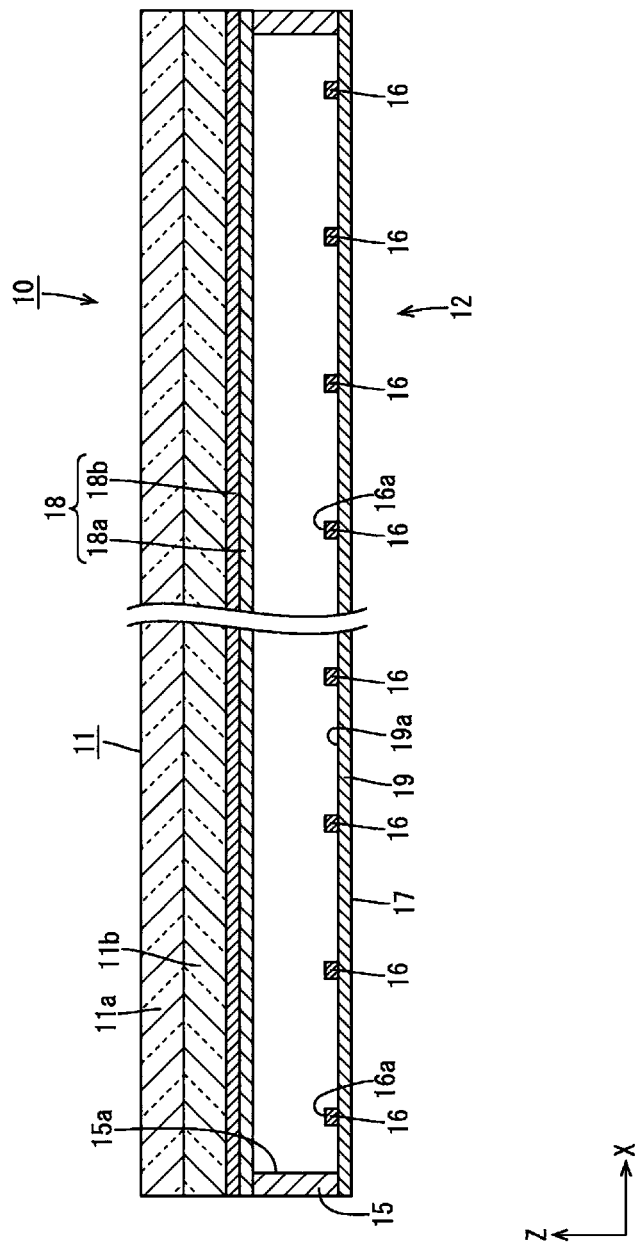
FIG. 2 is a sectional view of the liquid crystal display device.

As illustrated in FIG. 2, the liquid crystal display device 10 includes at least a liquid crystal panel (display panel) 11 that is capable of displaying an image, and a backlight device (lighting device) 12 that is an external light source disposed on the back side (light incident side) of the liquid crystal panel 11 and radiating light for display to the liquid crystal panel 11. The liquid crystal panel 11 and the backlight device 12 are fixed via a not-illustrated fixing member (such as an OCA tape).

First, a configuration of the liquid crystal panel 11 will be described. As illustrated in FIG. 1, an external shape of the liquid crystal panel 11 in plan view is not a general quadrilateral shape (rectangular shape or square shape), but is an irregular shape (non-rectangular shape) as a whole because a part of a contour forming the external shape is formed into a curved shape like a circular arc. More specifically, an almost half of the liquid crystal panel 11 on an upper side which is illustrated in FIG. 1 has a contour forming an almost, circular arc in plan view and an almost half of the liquid crystal panel 11 on a lower side which is illustrated in FIG. 1 has a contour like a part of a rectangular shape in plan view. The liquid crystal panel 11 described above is formed into a semicircular shape on the whole. In the present specification, for convenience of description, the upper side of the liquid crystal panel 11, which is illustrated in FIG. 1, is referred to as a "semicircular side" and the lower side which is illustrated in FIG. 1 is referred to as a "rectangular side" in some cases. Note that, among the contours that form the external shape of the liquid crystal panel 11, a portion on the rectangular shade side, which linearly extends in a right-and-left direction of FIG. 1, is coincident with the X-axis direction.

As illustrated in FIG. 1, the liquid crystal panel 11 has a display area A1 on a center side of a screen, on which an image is able to be displayed, and a non-display area A2 on an outer peripheral end side of the screen, which surrounds the display area A1 and on which an image is not able to be displayed. The display area A1 and the non-display area A2 have an external shape following the external shape of the liquid crystal panel 11, and have a contour forming an almost circular arc in plan view and a contour like a part of a rectangular shape in plan view. Moreover, in the non-display area A2, on an end portion of the liquid crystal panel 11 on the rectangular side, a driver (driving component) 13 and a flexible substrate 14 are mounted. The driver 13 is constituted by an LSI chip having a driving circuit inside and processes various kinds of signals that are transmitted by the flexible substrate 14. The flexible substrate 14 is obtained by forming a plurality of wiring patterns on a substrate with insulation properties and flexibility, and transmits various kinds of signals, which are output from a not illustrated control substrate (signal supply source), to the liquid crystal panel 11 by being connected to the end portion of the liquid crystal panel 11 on the rectangular side and the control substrate.

As illustrated in FIG. 2, the liquid crystal panel 11 is configured in such a manner that a pair of substrates 11a and 11b that are made of glass are bonded in a state of being separated from each other by a predetermined gap and a liquid crystal layer (not illustrated) including a liquid crystal molecule that is a material whose optical characteristics change in accordance with electric field application is enclosed between the substrates 11a and 11b. On an inner surface side of the array substrate (active matrix substrate or TFT substrate) 11b which is disposed on the back side of the pair of substrates 11a and 11b, TFTs (switching elements) and pixel electrodes connected to the TFTs are planarly arranged in matrix and an alignment film or the like is further provided. On the other hand, on an inner surface side of the OF substrate (counter substrate) 11a which is disposed on the front side, a color filter in which colored parts of R (red), G (green), B (blue), and the like are planarly arranged in matrix at predetermined arrangement is provided, and a light shielding layer (black matrix) that is disposed between the colored parts and formed into a lattice shape, counter electrodes in flat, which face the pixel electrodes, an alignment film, and the like are further provided. Note that, a polarizing plate is disposed on each of outer surface sides of both of the substrates 11a and 11b.

Next, a configuration of the backlight device 12 will be described. As illustrated in FIG. 2, the backlight device 12 includes a frame-like member 15 that includes a light output unit 15a by which light is output to the front side (side of the liquid crystal panel 11), an LED (light source) 16 which is surrounded by the frame-like member 15, an LED substrate (light source substrate) 17 on which the LED 16 is mounted, and an optical member 18 which is disposed on the light output unit 15a in an opposed manner at an interval to the LED 16 and the LED substrate 17 and which has a plate shape or a sheet shape (planar shape). As above, the backlight device 12 according to the present embodiment has the LED 16 that is disposed at a position directly under the liquid crystal panel 11 and the optical member 18 so that a light emitting surface 16a of the LED 16 is provided in an opposed manner, and is of a so-called direct type. An external shape of the backlight device 12 is configured to follow the external shape of the liquid crystal panel 11, and has a contour forming an almost circular arc in plan view and a contour like a part of a rectangular shape in plan view. Each component of the backlight device 12 will be described below in detail.

As illustrated in FIG. 2, the frame-like member 15 is formed into a frame shape (picture frame shape) that extends along an outer peripheral end portion of the liquid crystal panel 11, the LED substrate 17, and the like. The frame-like member 15 is open to both of front and back sides along a Z-axis direction (direction normal to a plate surface of the LED substrate 17), and a portion open toward the front side of the front and back sides constitutes the light output unit 15a. The frame-like member 15 is configured by connecting a part having a contour forming an almost circular arc in plan view and a part having a contour like a part of a rectangular shape in plan view. The frame-like member 15 supports an outer peripheral end portion of the optical member 18 from the back side by an opening edge on the front side, which demarcates the light output unit 15a.

As illustrated in FIG. 2, the LED 16 is surface-mounted on the LED substrate 17 and is of a so-called top-emitting type in which the light emitting surface 16a faces a side (front side) opposite to a side of the LED substrate 17. The LED 16 has a positional relationship that the light emitting surface 16a faces a plate surface of the optical member 18. The LED 16 is configured by sealing, with sealant, an LED chip (LED element), which is a semiconductor light emitting element, on a substrate portion fixed on the plate surface of the LED substrate 17. The LED 16 is one in which an LED chip emits monochromatic light, for example, such as blue light and emits white light as a whole when phosphors (a yellow phosphor, a green phosphor, a red phosphor, and the like) are dispersed and mixed in the sealant.

Figure 7:
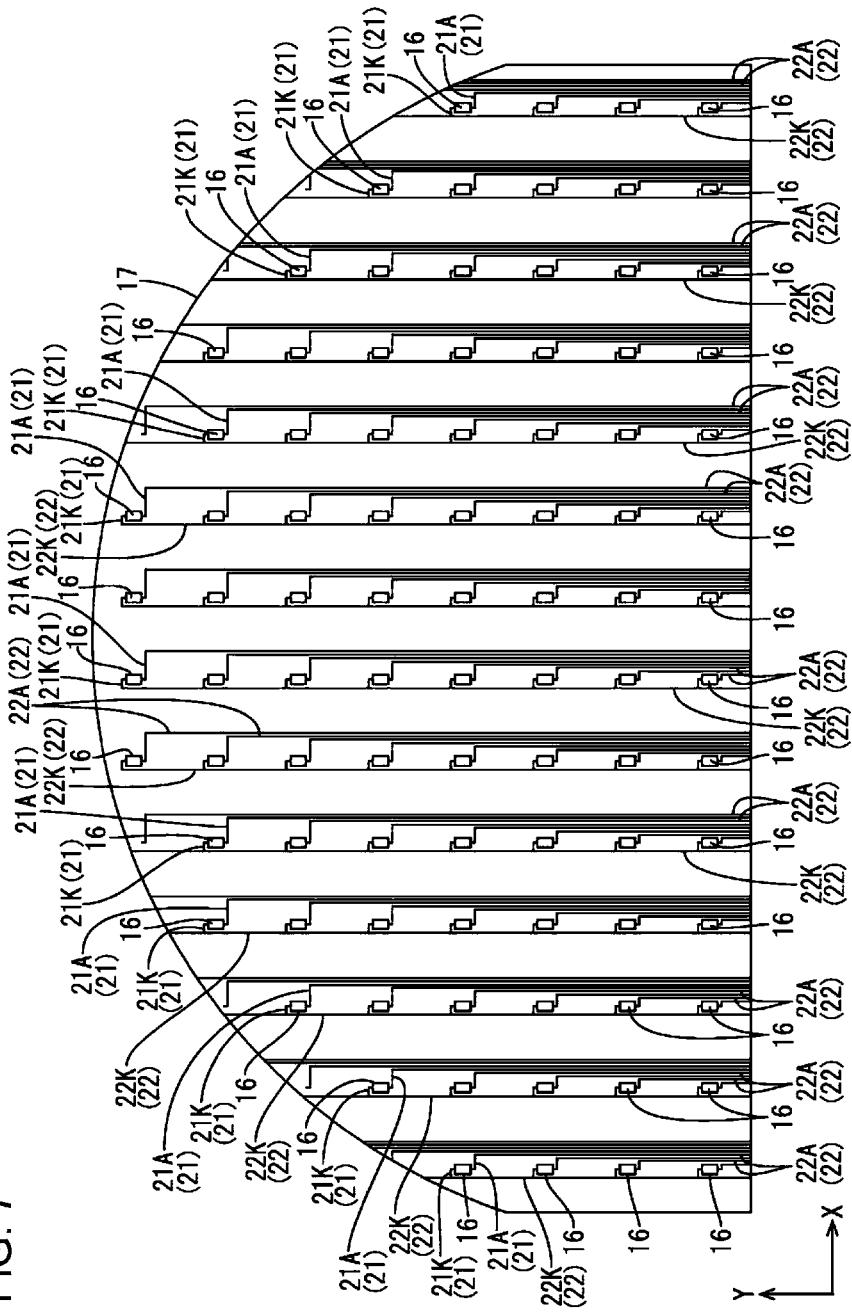
FIG. 7 is a plan view of an LED substrate obtained by removing a part of the common LED substrate.
Figure 8:
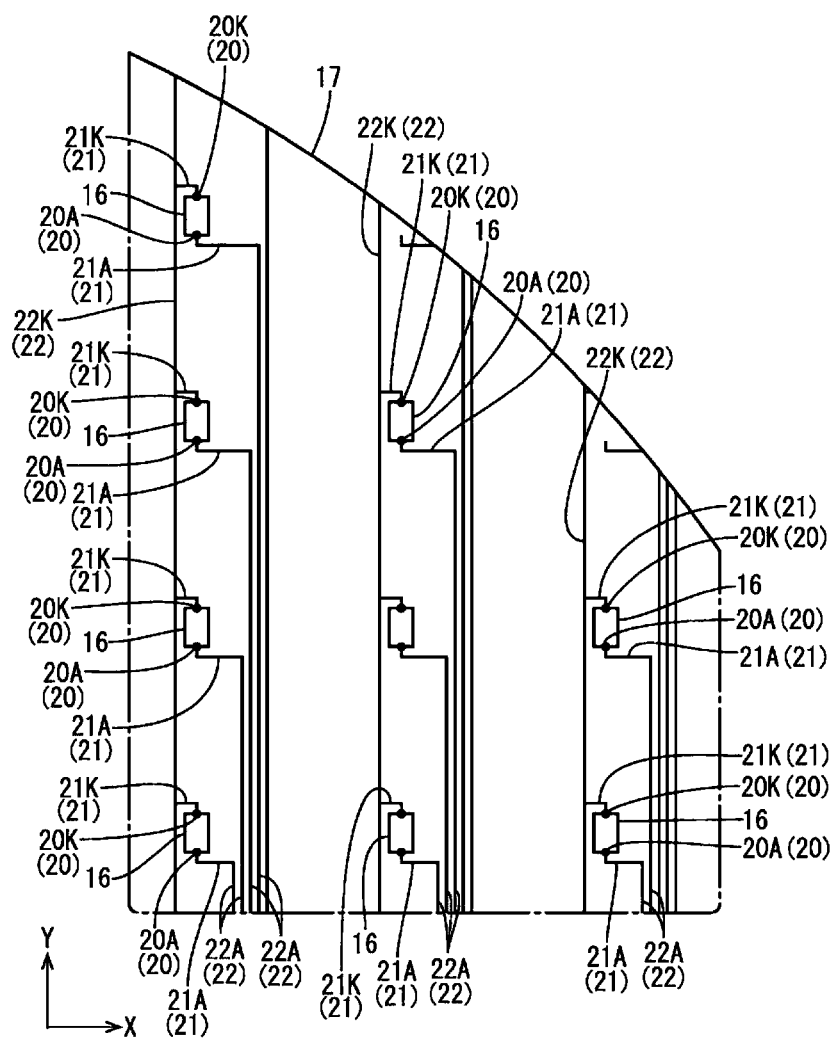
FIG. 8 is an enlarged view of FIG. 7.

As illustrated in FIG. 2, the LED substrate 17 has an external shape following external shapes of the liquid crystal panel 11 and the frame-like member 15, has a contour forming an almost circular arc in plan view and a contour like a part of a rectangular shape in plan view, and is disposed so as to close a portion in the frame-like member 15, which is open toward the back side. The LED substrate 17 is formed by an insulating substrate 19 that is made of an insulating material such as glass epoxy resin or polyimide. A plate surface of the insulating substrate 19 on the front side faces the optical member 18, and the plate surface is set as a mounting surface 19a on which the LED 16 that has the aforementioned configuration is surface-mounted. As illustrated in FIG. 7, on the mounting surface 19a of the insulating substrate 19, a plurality of LEDs 16 are disposed side by side in matrix with intervals both in the X-axis direction (row direction) and a Y-axis direction (column direction). Specifically, among the plurality of LEDs 16 that are arranged in matrix in the mounting surface 19a of the insulating substrate 19, a plurality of LEDs 16 that are arranged along the Y-axis direction (array direction in which the LEDs 16 form a column) constitutes one LED column and a plurality of such LED columns are disposed side by side along the X-axis direction with intervals. The number of LEDs 16 that constitute each of the LED columns is relatively large on a center side of the X-axis direction in the LED substrate 17, and is relatively small on both end sides in the X-axis direction. A wiring pattern to supply power to each LED 16 is formed in the mounting surface 19a of the insulating substrate 19. The wiring pattern will be described in detail later. Note that, a reflective layer (not illustrated) that appears white or silver excellent in light reflectivity is preferably formed in an outermost surface of the insulating substrate 19. Moreover, a reflective sheet (not illustrated) is able to be installed, instead of the reflective layer, so as to cover the insulating substrate 19 from the front side.

As illustrated in FIG. 2, the optical member 18 has an external shape following the external shapes of the liquid crystal panel 11 and the frame-like member 15, and is disposed so as to cover the light output unit 15a of the frame-like member 15. The optical member 18 is arranged so as to be interposed between the liquid crystal panel 11 and the LED 16 in the Z-axis direction, and has a function of, while applying a predetermined optical action to light which is emitted from the LED 16 and reaches the light output unit 15a, causing the light to output toward the liquid crystal panel 11. The optical member 18 faces the LED 16 with a predetermined interval on the front side, that is, a light exit side. The optical member 18 includes two types of a diffusion plate 18a and an optical sheet 18b. The diffusion plate 18a has a plate thicker than that of the optical sheet 18b that is the other one, is configured by dispersing a large number of diffusion particles (diffusion materials) in a base material (light transmission plate) that is made of almost transparent synthetic resin (for example, such as polycarbonate or acryl), and has a function of diffusing passing light. Examples of the optical sheet 18b include a diffusion sheet, a prism sheet, and a reflective polarizing sheet, and one or a plurality of them are able to be selected and used as appropriate. The plate thickness of the optical sheet 18b is thinner than the plate thickness of the diffusion plate 18a.

Figure 3:
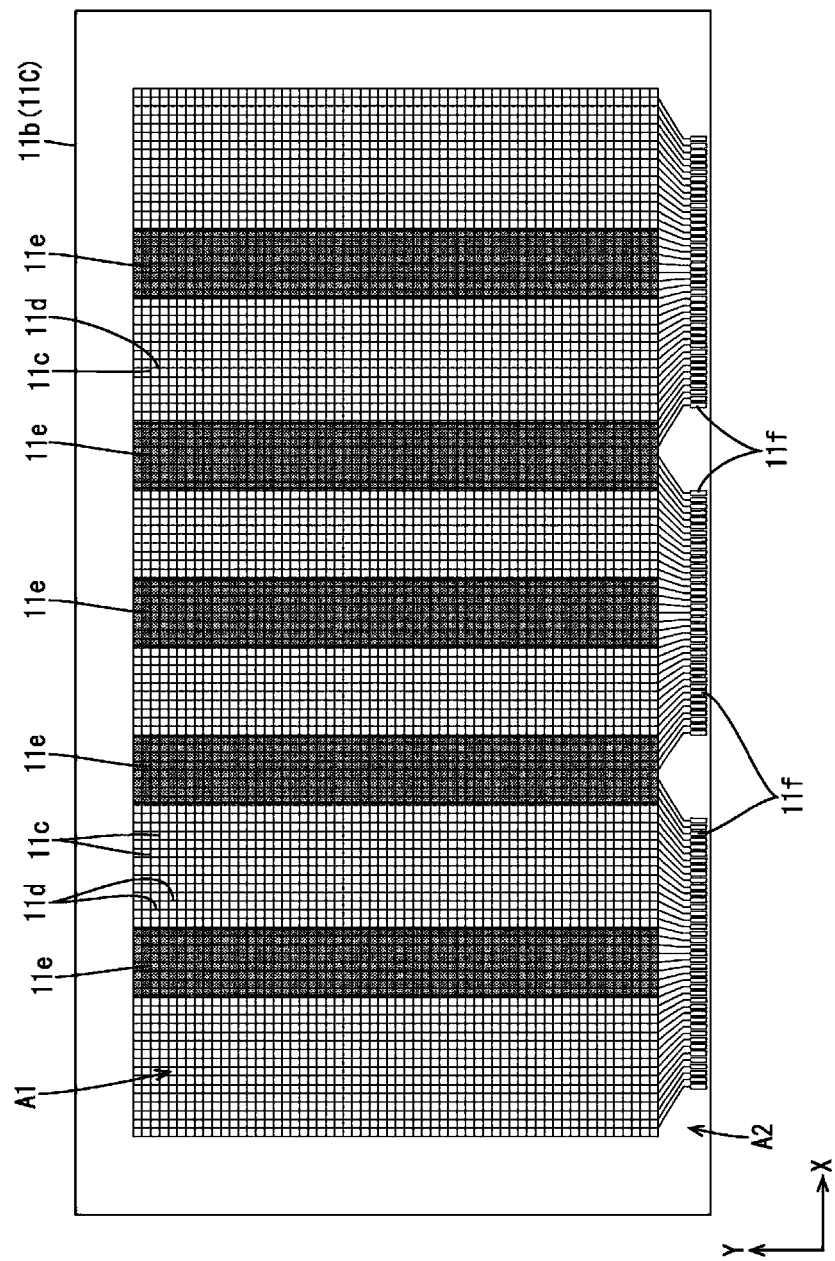
FIG. 3 is a plan view of an array substrate that constitutes a common liquid crystal panel.

Here, the liquid crystal panel 11 has the following configuration. That is, as illustrated in FIG. 3, in the display area A1 in the array substrate 11b that constitutes the liquid crystal panel 11, a large number of gate wires 11c and a large number of source wires 11d by which a scanning signal and an image signal are transmitted to the TFTs disposed in matrix are provided so as to be orthogonal to each other, and a gate driving unit (scanning driving unit) 11e that, by supplying a scanning signal to each of the gate wires 11c, sequentially scans each of the TFTs and selectively performs driving is provided. Note that, a forming range of the gate driving unit 11e is illustrated in half-tone dot meshing in FIG. 3. Each of the gate wires 11c extends along the X-axis direction and the large number of gate wires 11c are disposed side by side along the Y-axis direction with intervals. Each of the source wires 11d extends along the Y-axis direction and the large number of source wires 11d are disposed side by side along the X-axis direction with intervals. The gate wires 11c and the source wires lid are pulled out from the display area A1 to the non-display area A2, and connected to a plurality of terminal units 11f that are disposed in an end part on a lower side in the non-display area A2, which is illustrated in FIG. 3. The gate driving unit 11e described next is also connected to the terminal units 11f. The gate driving unit 11e has a band shape extending along the Y-axis direction, and a plurality of (five in FIG. 3) gate driving units 11e are disposed side by side in the display area A1 in the X-axis direction with intervals. That is, the gate driving unit 11e extends so as to cross all the large number of gate wires 11c that are arranged side by side along the Y-axis direction, and is able to sequentially supply a scanning signal to the gate wires 11e. The gate driving unit 11e is monolithically provided on the array substrate 11b by using semiconductor films included in the TFTs, and includes a circuit that outputs a scanning signal at predetermined timing, a buffer circuit that amplifies the scanning signal, and the like.

Then, as illustrated in FIG. 3, since the plurality of gate driving units 11e are arranged in a distributed manner in the X-axis direction in the display area A1, even when, in the array substrate 11b, a part on a side opposite to a side of the terminal units 11f, serving as a signal supply source, in the Y-axis direction is removed to some extent, it is possible to process a signal supplied from the terminal units 11f in the gate driving units 11e and output the resultant to all the remaining gate wires 11c. Accordingly, a common liquid crystal panel (common display panel) 11C that includes the array substrate 11b whose planar shape is a rectangular shape as illustrated in FIG. 3 is manufactured in advance, and processing for removing a part of the common liquid crystal panel 11C in accordance with an external shape of the liquid crystal display device 10 that is ordered from a customer is performed, making it possible to manufacture the liquid crystal panel 11 in an irregular shape (non-rectangular shape) in response to a customer demand at low cost within a short time (refer to FIG. 9). On the other hand, for manufacturing the backlight device 12 that radiates light for display to the liquid crystal panel 11 in an irregular shape as described above, it is conventionally necessary that an external shape of the backlight device 12 is made to conform to the external shape of the liquid crystal panel 11 and design by which the number of LEDs 16 to be arranged, arrangement thereof, and the like are optimized is performed for each order in order to avoid occurrence of a defect in output light of the backlight device 12, such as luminance unevenness, resulting in that a problem of high manufacturing cost or the like is caused.

Figure 4:
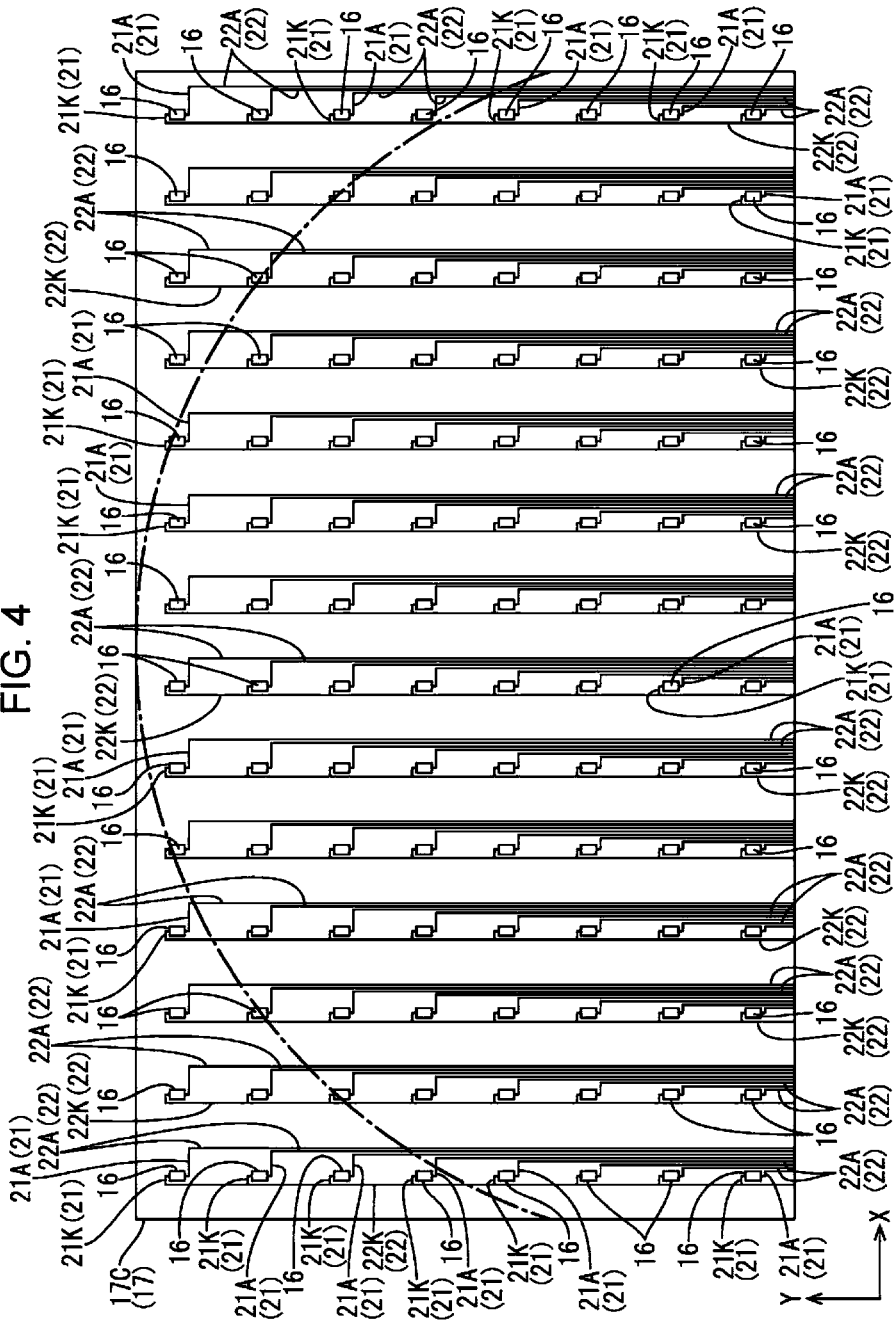
FIG. 4 is a plan view of a common LED substrate included in a backlight device that constitutes the liquid crystal display device.
Figure 6:
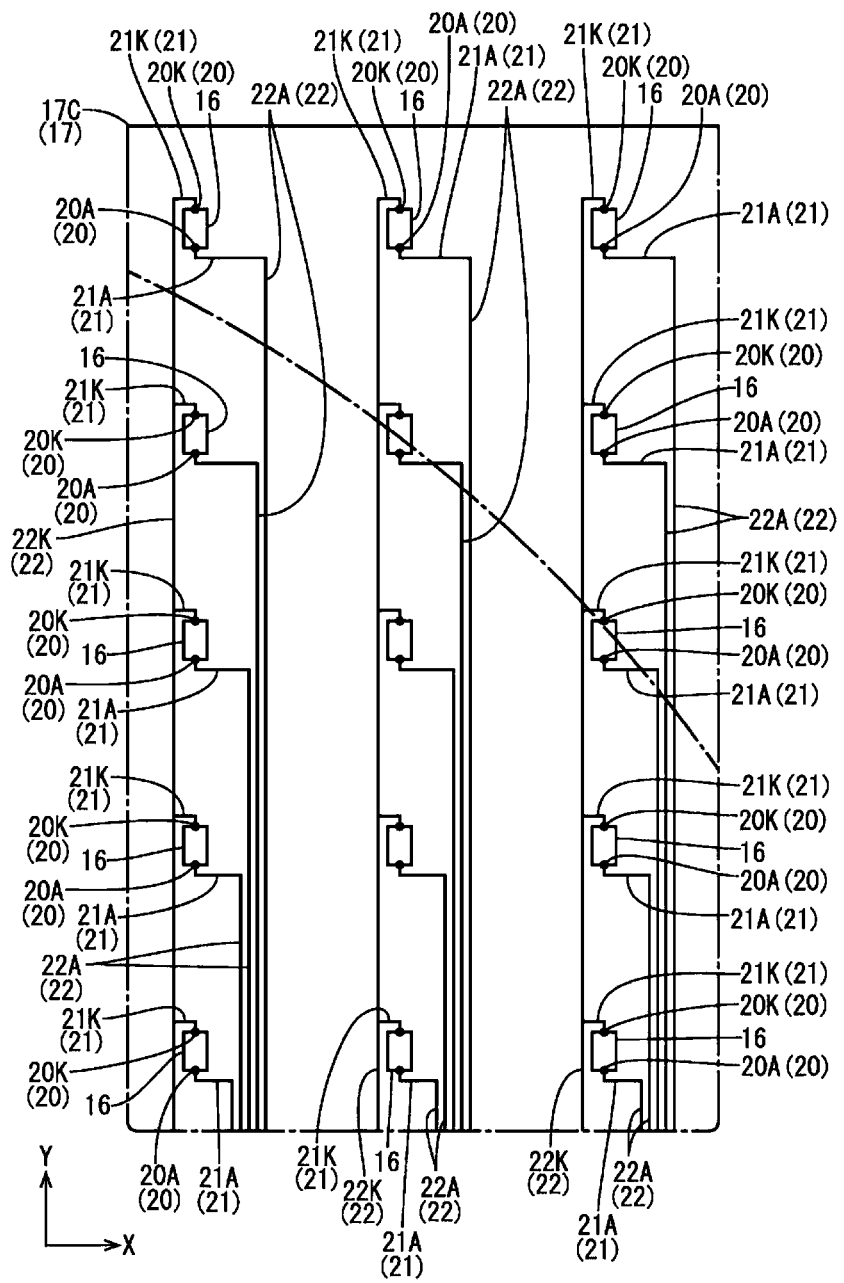
FIG. 6 is an enlarged view of FIG. 4.

Then, in the present embodiment, a common LED substrate (common light source substrate) 17C that has an external shape of a rectangular shape similarly to the common liquid crystal panel 11C is manufactured in advance as illustrated in FIG. 4 and processing for removing a part of the common LED substrate 17C in accordance with an external shape of the liquid crystal display device 10 that is ordered from a customer is performed, making it possible to manufacture the liquid crystal display device 10 and the backlight device 12 that have an irregular shape in response to a customer demand at low cost within a short time. Note that, a cutting-scheduled line (processing line) of the common LED substrate 17C is illustrated in FIG. 4 by a one-dot chain line, and the cutting-scheduled line follows the external shape of the liquid crystal panel 11 illustrated in FIG. 1. In order to enable processing of the common LED substrate (common light source substrate) 17C as described above, the LED substrate 17 has the following configuration and wiring pattern. First, as illustrated in FIGS. 4 and 6, the LEDs 16 that are mounted on the LED substrate 17 have electrodes 20 for power supply, and disposed side by side along the Y-axis direction to form columns. Note that, each of the electrodes 20 is illustrated as a black round mark in FIGS. 6 and 8. Then, the LED substrate 17 includes a plurality of first wires 21 that are connected to the electrodes 20 in the plurality of LEDs 16 that form the columns and second wires 22 which are pulled out toward one end side (lower side of FIG. 4) in the array direction (Y-axis direction) of the plurality of LEDs 16 that form the columns and are connected with the plurality of first wires 21. Each of the first wires 21 has a substantially L shape as a planar shape, and extends toward a side opposite to a side of the LED 16 along the Y-axis direction from a position connected with the electrode 20, is then bent at substantially right angle, and extends along the X-axis direction, and an extended end thereof is connected with a second wire 22. According to the aforementioned configuration, first, the plurality of LEDs 16 that form columns are lit by supply of power, which is transmitted through the second wires 22, to the electrodes 20 via the plurality of first wires 21.

Figure 9:
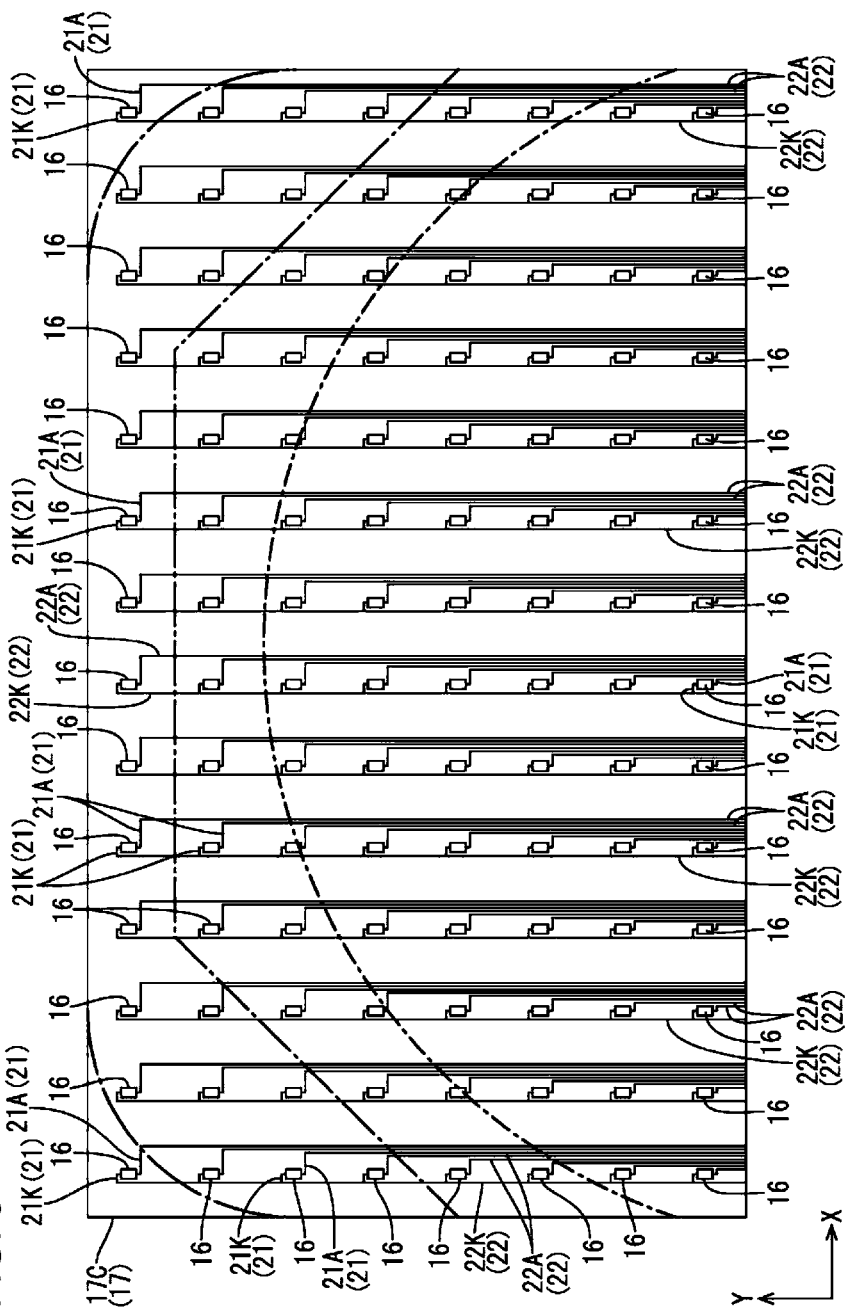
FIG. 9 is a plan view of the common LED substrate.

Then, as illustrated in FIG. 4, the second wire 22 that is connected to each of the plurality of first wires 21 is pulled out toward the one end side (lower side of FIG. 4) in the array direction (Y-axis direction) of the plurality of LEDs 16, as mentioned above. The second wire 22 extends substantially straight along the Y-axis direction, and the one end side and the other end side thereof are respectively connected with a not-illustrated power supply terminal and the first wire 21. A power supply connector connected to an LED driving circuit substrate (neither the power supply connector nor the LED driving circuit substrate is illustrated) is connected to the power supply terminal. Note that, the LED driving circuit substrate includes an LED driving circuit 23 that supplies DC current to the LEDs 16 (refer to FIG. 5). Accordingly, even in a case where, from among the plurality of LEDs 16 that are arranged to form a column, an LED 16 that is disposed on the other end side (upper side of FIG. 4) in the array direction is removed together with the first wire 21, by the second wire 22 that is pulled out toward the one end side (power supply terminal side) in the array direction, power supply is maintained in the first wire 21 which is connected to an electrode 20 of an LED 16 (LED 16 that is disposed closer to the one end side in the array direction than the LED 16 that is removed) which is remained without being removed. Thereby, when the common LED substrate 17C whose planar shape is a rectangular shape as illustrated in FIG. 4 is manufactured in advance, and processing for removing a part of the common LED substrate 17C in accordance with the external shape of the liquid crystal display device 10 that is ordered from a customer is performed, it is possible to manufacture the LED substrate 17 and the backlight device 12 that have an irregular shape (non-rectangular shape) in response to a customer demand as illustrated in FIG. 9 at low cost within a short time. Accordingly, the aforementioned configuration is suitable to achieve cost reduction as compared to a case where the number of LEDs 16 to be arranged, arrangement thereof, and the like are individually designed in accordance with a change in an external shape of a backlight device as in a conventional case. Note that, in addition to the LED substrate 17 illustrated in FIG. 7, the LED substrate 17 whose planar shape is a substantially trapezoid and the LED substrate 17 that has an external shape in which a pair of corners are rounded are illustrated in FIG. 9 by one-dot chain lines. Then, for manufacturing the liquid crystal display device 10, the external shape of the backlight device 12 is able to be freely changed in accordance with the external shape of the liquid crystal panel 11, so that the aforementioned configuration is suitable to achieve reduction in manufacturing cost related to the liquid crystal display device 10. Moreover, even in a case where failure or the like occurs in any of the plurality of LEDs 16, since the second wires 22 are connected to the plurality of first wires 21 so that power supply to the plurality of LEDs 16 is individually performed, power supply to an LED 16 in which failure or the like does not occur is maintained.

Particularly, it is set that the backlight, device 12 according to the present embodiment is of the so-called direct type, and has a configuration in which the plurality of LEDs 16 are arranged in matrix and mounted on the mounting surface 19a of the insulating substrate 19 of the LED substrate 17 and all the LEDs 16 are collectively surrounded by the frame-like member 15 from an outer peripheral side as illustrated in FIG. 4. In the plurality of LED columns included in the plurality of LEDs 16 that are arranged in matrix, even in a case where the LED 16 and the like which is disposed on the other end side in the Y-axis direction (array direction of the LEDs 16, column direction) is removed together with a part of the LED substrate 17, power supply is maintained in the LED 16 that is remained without being removed, as mentioned above. This makes it possible to easily change the external shape of the LED substrate 17 and the external shape of the backlight device 12 after the backlight device 12 is manufactured, resulting in more suitable configuration to achieve cost reduction.

More specifically, as illustrated in FIG. 6, in the LED 16 that is mounted on the LED substrate 17, the electrodes 20 are composed of an anode electrode (positive electrode) 20A and a cathode electrode (negative electrode) 20K. Meanwhile, the first wires 21 are composed of an anode-side first wire (positive-side first wire) 21A that is connected to the anode electrode 20A and a cathode-side first wire (negative-side first wire) 21K that is connected to the cathode electrode 20K. The anode-side first wire 21A extends along the Y-axis direction toward a side opposite to the side of the LED 16 from a position connected with the anode electrode 20A and the cathode-side first wire 21K extends along the Y-axis direction toward a side opposite to the side of the LED 16 from a position connected with the cathode electrode 20K, and then the anode side first wire 21A and the cathode-side first wire 21K are bent at substantially right angle and extend in mutually opposite directions in the X-axis direction. Anode-side first wires 21A and cathode-side first wires 21K the number of each of which is the same as the number of LEDs 16 that constitutes one LED column are provided. The second wires 22 are composed of an anode-side second wire (positive-side second wire) 22A which is connected with each of a plurality of anode-side first wires 21A, and a cathode-side second wire (negative-side second wire) 22K which is connected with each of a plurality of cathode-side first wires 21K. The anode-side second wire 22A and the cathode-side second wire 22K are disposed so as to put an LED column that is a target to be connected therebetween from both sides in the X-axis direction. In FIG. 6, the anode-side second wire 22A is disposed on a right side of an LED column and the cathode-side second wire 22K is disposed on a left side of the LED column. According to the aforementioned configuration, the plurality of LEDs 16 are lit by supplying power, which is transmitted through the anode-side second wire 22A and the cathode-side second wire 22K, to anode electrodes 20A and cathode electrodes 20K via the plurality of anode side first wires 21A and the plurality of cathode-side first wires 21K.

Figure 5:
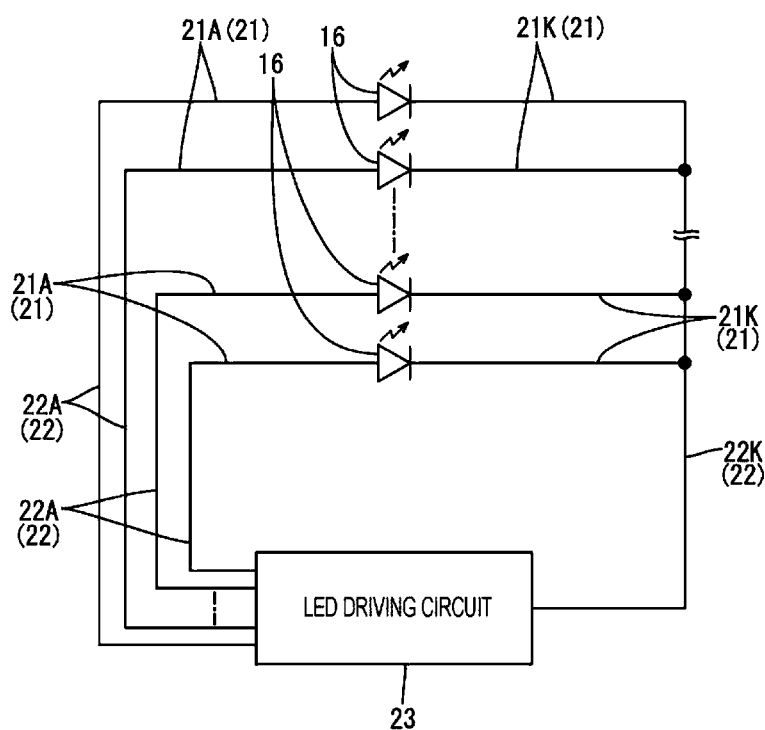
FIG. 5 is a block diagram indicating an electrical configuration related to an LED.

Then, as illustrated in FIGS. 4 and 5, whereas the number of cathode-side second wires 22K that is one of the anode-side second wire 22A and the cathode-side second wire 22K is set to be one, the number of anode-side second wires 22A that is the other one is set to be the same as the number of LEDs 16. Only one cathode-side second wire 22K is disposed for a column of the LEDs 16 which is a target to be connected, and all the cathode-side first wires 21K the number of which is the same as the number of the plurality of LEDs 16 that form the column are collectively connected thereto. On the other hand, the anode-side second wires 22A the number of which is the same as the number of the plurality of LEDs 16 that form the column are provided, and are individually connected with the anode-side first wires 21A the number of which is the same as the number of the plurality of LEDs 16 that form the column. The plurality of anode-side second wires 22A are disposed side by side in parallel to each other with intervals in the X-axis direction. Accordingly, the number of second wires 22 is able to be reduced as compared to a case where both of the numbers of anode-side second wires and cathode-side second wires are assumed to the same as that of LEDs 16. Moreover, by setting only the number of cathode-side second wires 22K to be one, the LED driving circuit 23 serving as a power supply circuit for the plurality of LEDs 16 is constituted as a series circuit, and thereby a circuit configuration becomes simple and is suitable to achieve cost reduction or the like as compared to a case where the LED driving circuit is assumed to be constituted as a parallel circuit.

In the present embodiment, the aforementioned structure is provided, and next, an action thereof will be described. For manufacturing the liquid crystal display device 10, the common liquid crystal panel 11C and the common LED substrate 17C that is a main component of the backlight device 12, a planar shape of each of which is a rectangular shape, are manufactured in advance (refer to FIGS. 3 and 4). In a case where an order related to the liquid crystal display device 10 in an irregular shape (non-rectangular shape) is placed by a customer, processing for removing a part of the common liquid crystal panel 11C and a part of the common LED substrate 17C is performed, and thereby the liquid crystal panel 11 and the LED substrate 17 that have an external shape in response to the order are obtained. Note that, as for the optical member 18, a common optical member (not illustrated) whose planar shape is a rectangular shape may be manufactured in advance similarly to the liquid crystal panel 11 and the LED substrate 17, and processing for removing a part thereof in response to the order may be performed. Furthermore, as for the frame-like member 15, one that has an external shape in response to the order may be manufactured.

In the aforementioned description, for manufacturing the LED substrate 17, the common LED substrate 17C with the external shape illustrated in FIGS. 4 and 6 is cut along a cutting-scheduled line illustrated in each figure by a one-dot chain line. With this processing, the common LED substrate 17C has a portion on the other end side (portion on an upper end side in FIGS. 4 and 6) of the insulating substrate 19 in the Y-axis direction removed together with an LED 16 that is mounted on the portion on the other end side, the first wire 21 that is connected to the LED 16, and a part of the second wire 22 which is disposed on the portion on the other end side. Thereby, the LED substrate 17 with the external shape in response to an order of a customer is able to be obtained. Here, in a case where a configuration in which the LED substrate is made of a conductive material and an insulating layer is interposed at least between the LED substrate and the first wire is assumed to be provided, when an LED or the like is removed together with a part of the LED substrate, there is a possibility that an insulation state due to the insulating layer is broken and the first wire is short-circuited to the LED substrate. In this point, since the LED substrate 17 is constituted by the insulating substrate 19, occurrence of short circuit, which is described above, at a time when a part of the LED substrate 17 is removed is avoided.

In the LED substrate 17 manufactured in this manner, as illustrated in FIGS. 5 and 7, among the plurality of LED columns that are arranged along the X-axis direction, as for a plurality of LED columns that are disposed on the center side in the X-axis direction, an LED 16 and the like are not removed, but as for a plurality of LED columns disposed on each of the both end sides in the X-axis direction, LEDs 16 that are disposed on the other end side in the Y-axis direction are removed together with the first wires 21 and the like. However, since the second wires 22 that are pulled out toward the one end side in the Y-axis direction are connected with the first wires 21 which are connected to the LEDs 16 that are remained, power supply to the LEDs 16 that are remained is maintained. Accordingly, the aforementioned configuration is suitable to achieve cost reduction as compared to a case where the number of LEDs 16 to be arranged, arrangement thereof, and the like are individually designed in accordance with a change in an external shape of a backlight device as in the conventional case. The LED substrate 17 obtained in the aforementioned manner is assembled with the frame-like member 15 and the optical member 18 that are separately manufactured, and thereby the backlight device 12 with an external shape in response to an order of a customer is obtained. Then, the backlight device 12 is assembled with the liquid crystal panel 11 that is separately manufactured by processing the common liquid crystal panel 11C, and thereby the liquid crystal display device 10 with an external shape in response to the order of the customer is obtained.

As described above, the backlight device (lighting device) 12 of the present embodiment includes the plurality of LEDs (light sources) 16 that include the electrodes 20 for power supply and are arranged to form a column, the plurality of first wires 21 that are connected to the electrodes 20 in the plurality of LEDs 16, and the second wire 22 that is connected with each of the plurality of first wires 21 and is pulled out toward the one end side in the array direction of the plurality of LEDs 16.

In such a manner, the plurality of LEDs 16 are lit by supplying power, which is transmitted through the second wires 22, to the electrodes 20 via the plurality of first wires 21. The second wires 22 that are connected to the plurality of first wires 21 are pulled out toward the one end side in the array direction of the plurality of LEDs 16. Accordingly, even in a case where, from among the plurality of LEDs 16 that are arranged to form columns, the LED 16 that is disposed on the other end side in the array direction is removed together with the first wire 21, by the second wire 22 that is pulled out toward the one end side in the array direction, power supply is maintained in a first wire 21 which is connected to an electrode 20 of an LED 16 which is remained without being removed. This makes it possible to easily change an external shape of the backlight device 12 by removing the LED 16 and the like as above after the backlight device 12 is manufactured, and thus, the aforementioned configuration is suitable to achieve cost reduction as compared to a case where the number of LEDs 16 to be arranged, arrangement thereof, and the like are assumed to be individually designed in accordance with a change in an external shape of a backlight device. Moreover, even in a case where failure or the like occurs in any of the plurality of LEDs 16, since the second wires 22 are connected to the plurality of first wires 21 so that power supply to the plurality of LEDs 16 is individually performed, power supply to an LED 16 in which failure or the like does not occur is maintained.

Furthermore, the LED 16 has the electrodes 20 composed of the anode electrode 20A and the cathode electrode 20K. The first wires 21 are composed of the anode-side first wire 21A that is connected to the anode electrode 20A and the cathode-side first wire 21K that is connected to the cathode electrode 20K. The second wires 22 are composed of the anode-side second wire 22A that is connected to each of the plurality of anode-side first wires 21A, and the cathode-side second wire 22K that is connected to each of the plurality of cathode-side first wires 21K, and at least one of the number of anode-side second wires 22A and the number of cathode-side second wires 22K is set to be one. In such a manner, the plurality of LEDs 16 are lit by supplying power, which is transmitted through the anode-side second wire 22A and the cathode-side second wire 22K, to the anode electrodes 20A and the cathode electrodes 20K via the plurality of anode-side first wires 21A and the plurality of cathode-side first wires 21K. By setting at least, one of the number of anode-side second wires 22A and the number of cathode-side second wires 22K to be one, the number of second wires 22 is able be reduced as compared to a case where both of the numbers of anode-side second wires and cathode-side second wires are assumed to be the same as that of LEDs 16.

Moreover, whereas one of the number of the anode-side second wires 22A and the number of the cathode-side second wires 22K is set to be one, the other is set to be the same as the number of LEDs 16. In such a manner, the LED driving circuit 23 serving as a power supply circuit for the plurality of LEDs 16 is constituted as a series circuit. Accordingly, a circuit configuration becomes simple and is suitable to achieve cost reduction or the like as compared to a case where the LED driving circuit serving as a power supply circuit is assumed to be constituted as a parallel circuit.

Moreover, the LED substrate (light source substrate) 17 on which the plurality of LEDs 16 are mounted and which is made of an insulating material is provided. In a case where a configuration in which the LED substrate is made of a conductive material and an insulating layer is interposed at least between the LED substrate and the first wire 21 is assumed to be provided, when a part of the LED substrate 17 is removed at a time when an LED, which is disposed on the other end side in the array direction among the plurality of LEDs 16 is removed, there is a possibility that an insulation state due to the insulating layer is broken and the first wire 21 is short-circuited to the LED substrate 17. In this point, as long as the LED substrate 17 is made of an insulating material as above, occurrence of short circuit, which is described above, is avoided even when the part of the LED substrate 17 is removed.

Moreover, the LED substrate 17 on which the plurality of LEDs 16 are mounted so as to be arranged in matrix and the frame-like member 15 which is formed into a frame shape so as to surround the plurality of LEDs 16 and which includes the light output unit 15a that is open toward the side opposite to the side of the LED substrate 17 to output light are provided. In such a manner, light emitted from the plurality of LEDs 16 that are arranged in matrix in the LED substrate 17 is released to an outside through the light output unit 15a that is in the frame-like member 15 surrounding the plurality of LEDs 16 and is open toward the side opposite to the side of the LED substrate 17. Here, in a case where the plurality of LEDs 16 that are arranged along the column direction constitute one LED column, a plurality of LED columns are disposed side by side along the row direction. In the plurality of LED columns, even in a case where the LED 16 and the like, which is disposed on the other end side in the column direction that is the array direction of the plurality of LEDs 16 that form the column, is removed together with a part of the LED substrate 17, power supply is maintained in the LED 16 that is remained without being removed, as mentioned above. This makes it possible to easily change the external shape of the LED substrate 17 and the external shape of the backlight device 12 after the backlight device 12 is manufactured, resulting in more suitable configuration to achieve cost reduction.

Moreover, the liquid crystal display device (display device) 10 according to the present embodiment includes the backlight device (lighting device) 12 which is described above and the liquid crystal panel (display panel) 11 that displays an image by using light radiated from the backlight device 12. According to the liquid crystal display device 10 that has the aforementioned configuration, in a case where the external shape of the liquid crystal panel 11 is changed by removing a part of the liquid crystal panel 11 after the liquid crystal panel 11 is manufactured, the external shape of the backlight device 12 is able to be freely changed in accordance with the external shape of the liquid crystal panel 11. Thus, it is possible to achieve cost reduction.

Embodiment 2

Embodiment 2 of the invention will be described with reference to FIG. 10. Embodiment 2 indicates one in which the number of LED substrates 117 to be used is changed. Note that, duplicate description of a structure, an action, and an effect similar to those of Embodiment 1 described above will be omitted.

Figure 10:
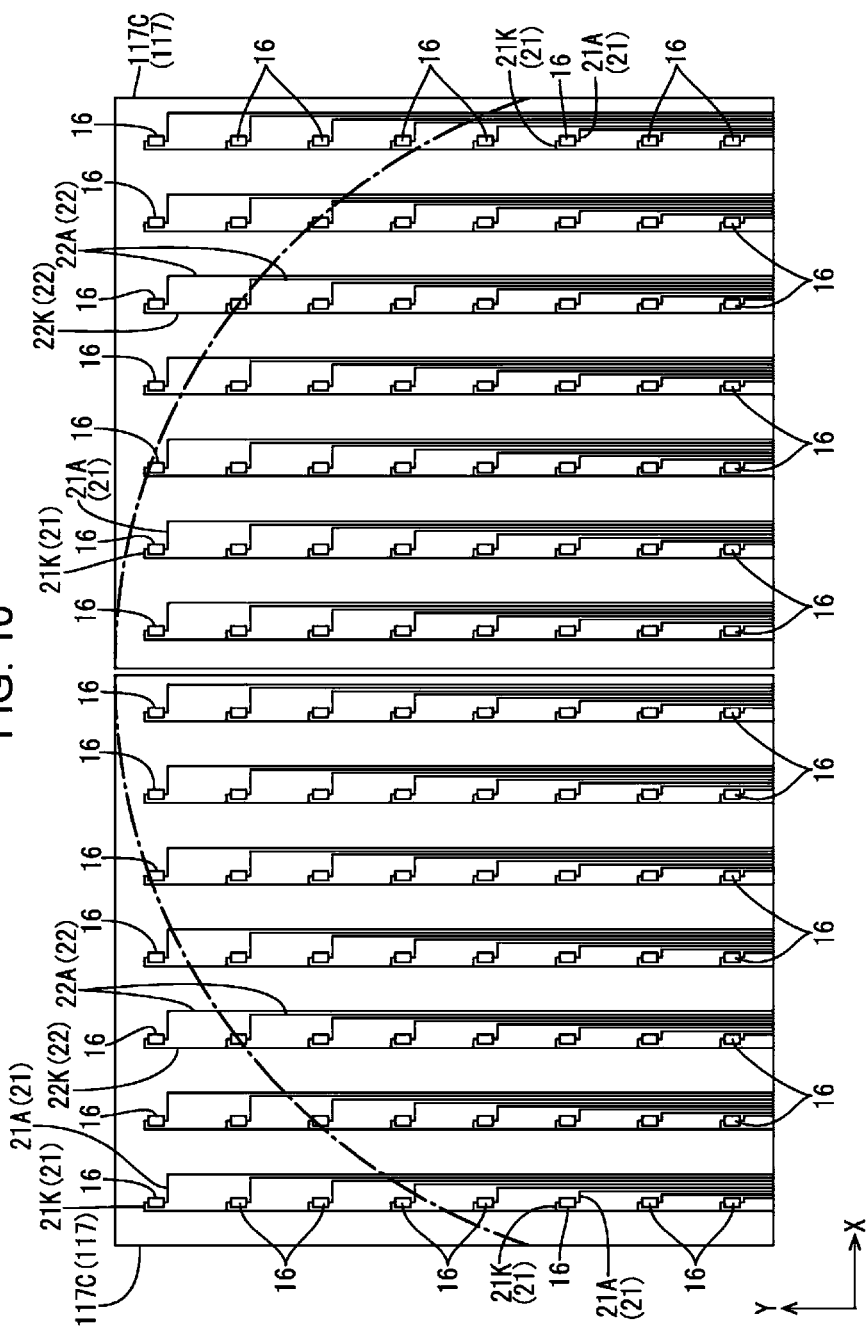
FIG. 10 is a plan view of a pair of common LED substrates included in a backlight device according to Embodiment 2 of the invention.

As illustrated in FIG. 10, a backlight device 112 according to present embodiment includes two LED substrates 117. The two LED substrates 117 are disposed side by side along the X-axis direction. In FIG. 10, common LED substrates 117C before processing are illustrated. A cutting-scheduled line illustrated in the figure by a one-dot chain line is drawn so as to cross over the two common LED substrates 117.

Embodiment 3

Embodiment 3 of the invention will be described with reference to FIGS. 11 to 13. Embodiment 3 indicates one in which a configuration of an LED substrate 217 is changed from that of Embodiment 1 described above. Note that, duplicate description of a structure, an action, and an effect similar to those of Embodiment 1 described above will be omitted.

Figure 11:
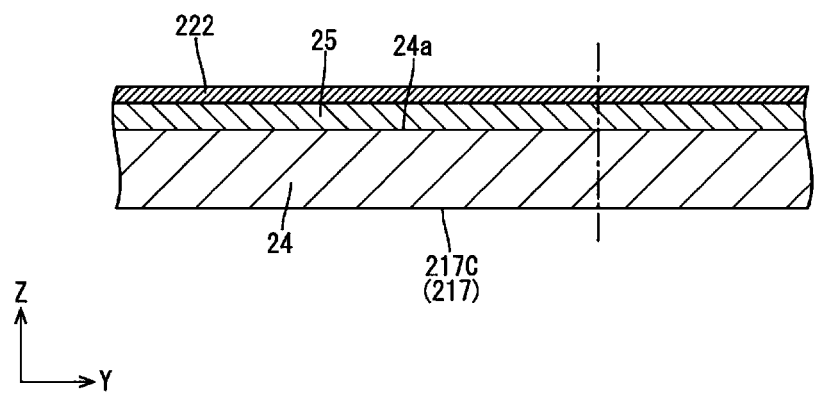
FIG. 11 is a sectional view of a common LED substrate included in a backlight device according to Embodiment 3 of the invention.

As illustrated in FIG. 11, the LED substrate 217 according to the present embodiment includes a conductive substrate 24 that is made of a conductive material such as aluminum and an insulating layer 25 that is disposed on a side of a mounting surface 24a of the conductive substrate 24 for an LED 216 and that is interposed between a first wire 221 and a second wire 222 and the conductive substrate 24 to insulate the first wire 221 and the second wire 222 and the conductive substrate 24. Note that, in FIG. 11, a common LED substrate 217C before processing is illustrated and a cutting-scheduled line is illustrated by a one-dot chain line. The first wire 221 and the second wire 222 are disposed on a surface on a side opposite to a side of the conductive substrate 24 in the insulating layer 25. By using the conductive substrate 24 in this manner, it is possible to efficiently diffuse heat generated in association with light emission of the LED 216.

Figure 12:
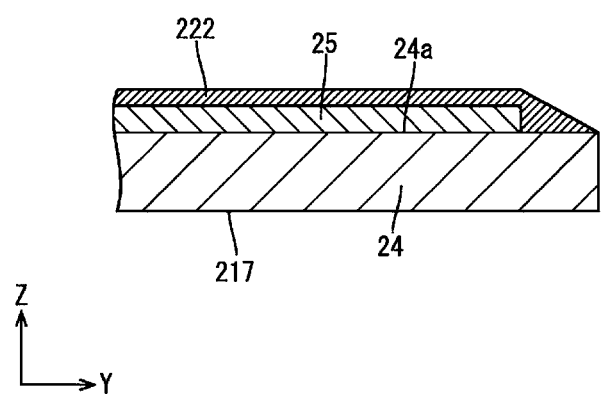
FIG. 12 is a sectional view of an LED substrate obtained by removing a part of a common LED substrate.
Figure 13:
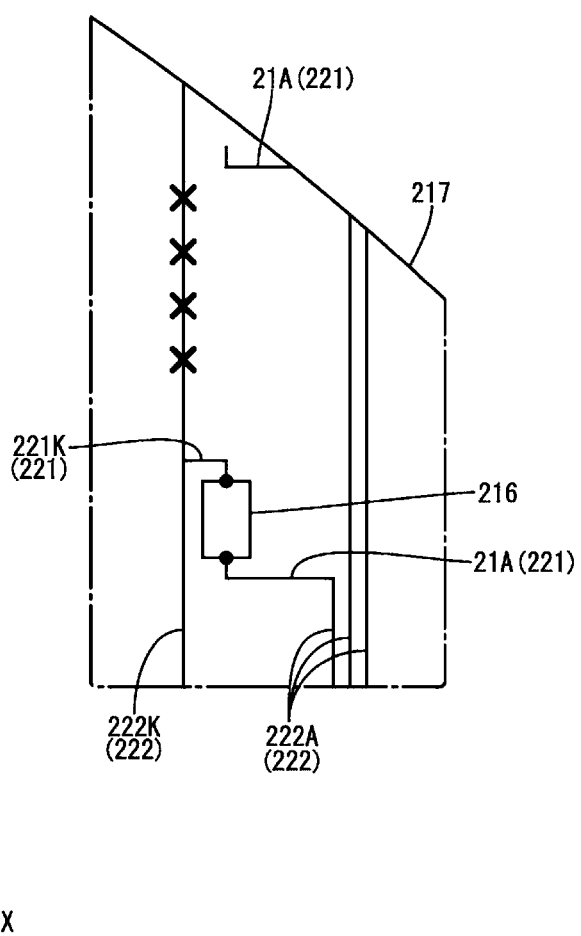
FIG. 13 is an enlarged plan view of the LED substrate obtained by removing a part of the common LED substrate.

As illustrated in FIG. 12, in a case where a part of the common LED substrate 217C that has the aforementioned configuration is removed in association with processing, there is a possibility that the insulating layer 25 is broken near a processed portion (cut portion). Even in a case where, among the first wire 221 and the second wire 222 that are disposed near the processed portion, the first wire 221 and an anode-side second wire 222A are short-circuited to the conductive substrate 24 due to the breakage of the insulating layer 25, there is no problem because an LED 216 that is removed is a target to be connected. However, since a cathode side second wire 222K connected also to an LED 216 that is remained, in a case where the cathode-side second wire 222K is short-circuited to the conductive substrate 24 due to the breakage of the insulating layer 25, the LED 216 that is remained is not able to be lit. Then, in the present embodiment, as illustrated in FIG. 13, laser processing by which the portion is intentionally disconnected by radiating laser light to a portion of the cathode-side second wire 222K, which is the processed portion in the LED substrate 217 and is disposed on the other end side in the Y-axis direction, is performed. The portion where laser is radiated is illustrated in FIG. 13 by a "X" mark. In the present embodiment, laser light is radiated to the cathode-side second wire 222K, which is a target for laser processing, at four portions that are separated in the Y-axis direction. In such a manner, even in the case where the cathode-side second wire 222K is short-circuited to the conductive substrate 24 due to the breakage of the insulating layer 25, which may occur when the common LED substrate 217C is processed, a portion of the short circuit is able to be electrically isolated from a portion of the cathode-side second wire 222K, which is connected with a cathode-side first wire 221K. Thereby, it is possible to avoid a situation in which the LED 216 that is remained is not able to be lit. Note that, at a stage before cutting processing of the common LED substrate 217C is performed, laser processing may be performed in advance for a portion of the cathode-side second wire 222K, which is disposed closer to the other end side in the Y-axis direction than the cutting-scheduled line.

Embodiment 4

Embodiment 4 of the invention will be described with reference to FIG. 14 or 15. Embodiment 4 indicates a case where an insulating member 26 is used instead of performing the laser processing in Embodiment 3 described above. Note that, duplicate description of a structure, an action, and an effect similar to those of Embodiment 3 described above will be omitted.

Figure 14:
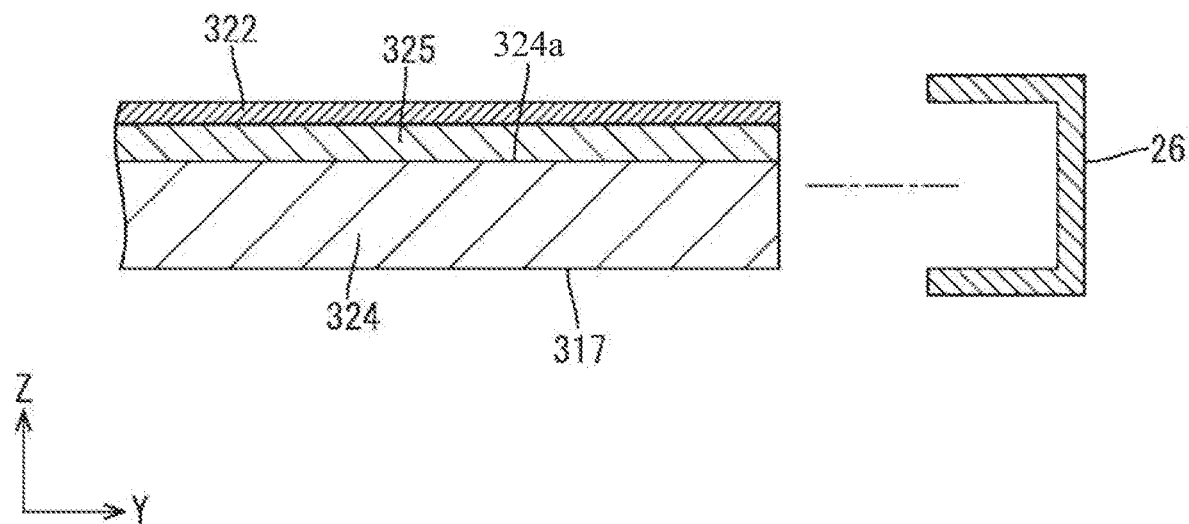
FIG. 14 is a sectional view illustrating a state before an insulating member is attached to a common LED substrate included in a backlight device according to Embodiment 4 of the invention.
Figure 15:
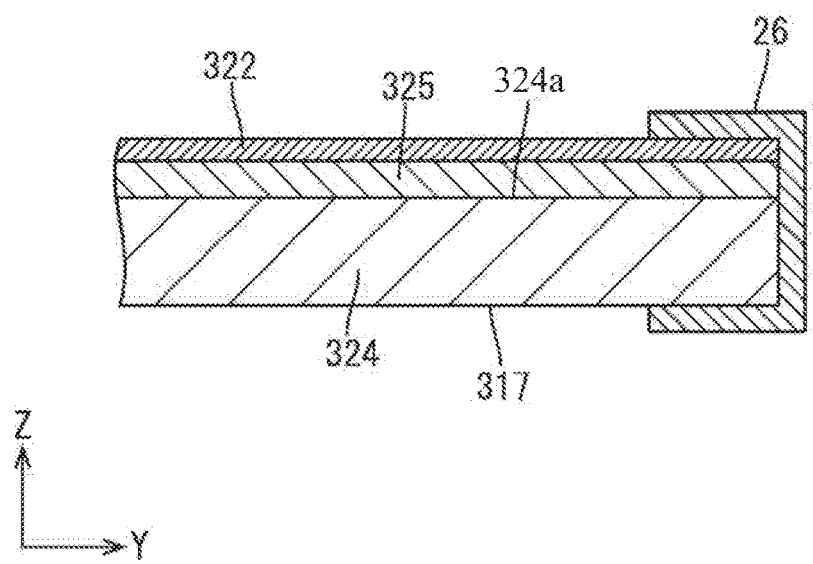
FIG. 15 is a sectional view illustrating a state where the insulating member is attached to the common LED substrate.

In an LED substrate 317 according to the present embodiment, as illustrated in FIGS. 14 and 15, the insulating member 26 is attached to an end portion on a side on which a part is removed in association with processing of the common LED substrate (not illustrated in the present embodiment). The insulating member 26 is made of synthetic resin having insulation properties, is attached to the end portion of the LED substrate 317 on the other end side in the Y-axis direction, and is formed to cover a portion of a second wire 322, which is disposed on the end portion on the other end side. The insulating member 26 covers, in the LED substrate 317, an end surface which is a surface subjected to cutting processing, a surface on which the second wire 322 is disposed, and a surface opposite thereto. Here, the second wire 322 is kept in a state of being insulated from a conductive substrate 324 by an insulating layer 325, but there is a possibility that, in a case where a conductive foreign matter from outside is stuck to the other end side in the Y-axis direction, the second wire 322 is caused to be short-circuited to the conductive substrate 324 via the conductive foreign matter. In this point, the insulating member 26 is attached in the aforementioned manner, and it is thereby possible to avoid that the conductive foreign matter from outside is stuck to a portion f the second wire 322 on the other end side in the Y-axis direction. Thus, it is possible to prevent occurrence of a situation in which the second wire 322 is caused to be short-circuited to the conductive substrate 324 due to a conductive foreign matter from outside. Note that, the insulating member 26 may be made of a tape material having insulation properties.

As described above, according to the present embodiment, the LED substrate 317 that includes the conductive substrate 324 on which the plurality of LEDs (not illustrated in the present embodiment) are mounted and which is made of a conductive material and the insulating layer 325 which is disposed on a side of a mounting surface 324a of the conductive substrate 324 for the LEDs and which is interposed at least between the second wire 322 and the conductive substrate 324 to insulate the second wire 322 and the conductive substrate 324 and the insulating member 26 that is attached to the end portion of the LED substrate 317 on the other end side in the array direction and is disposed so as to cover at least a portion of the second wire 322, which is disposed on the end portion of the LED substrate 317 on the other end side, are provided. In a case where a part of the LED substrate 317 is removed when an LED that is disposed on the other end side in the array direction among the plurality of LEDs is removed, it is concerned that a conductive foreign matter from outside contacts the portion of the second wire 322, which is disposed on the end portion of the LED substrate 317 on the other end side in the array direction, and the conductive substrate 324 and thereby short-circuit occurs. In this point, the insulating member 26 is attached to the end portion on the other end side in the form of covering the portion of the second wire 322, which is disposed on the end portion of the LED substrate 317 on the other end side in the array direction, so that it is possible to prevent occurrence of a situation in which the second wire 322 is caused to be short-circuited to the conductive substrate 324 due to a conductive foreign matter from outside.

Embodiment 5

Embodiment 5 of the invention will be described with reference to FIG. 16 or 17. Embodiment 5 indicates one in which a configuration of a conductive substrate 424 is changed from that of Embodiment 3 described above. Note that, duplicate description of a structure, an action, and an effect similar to those of Embodiment 3 described above will be omitted.

Figure 16:
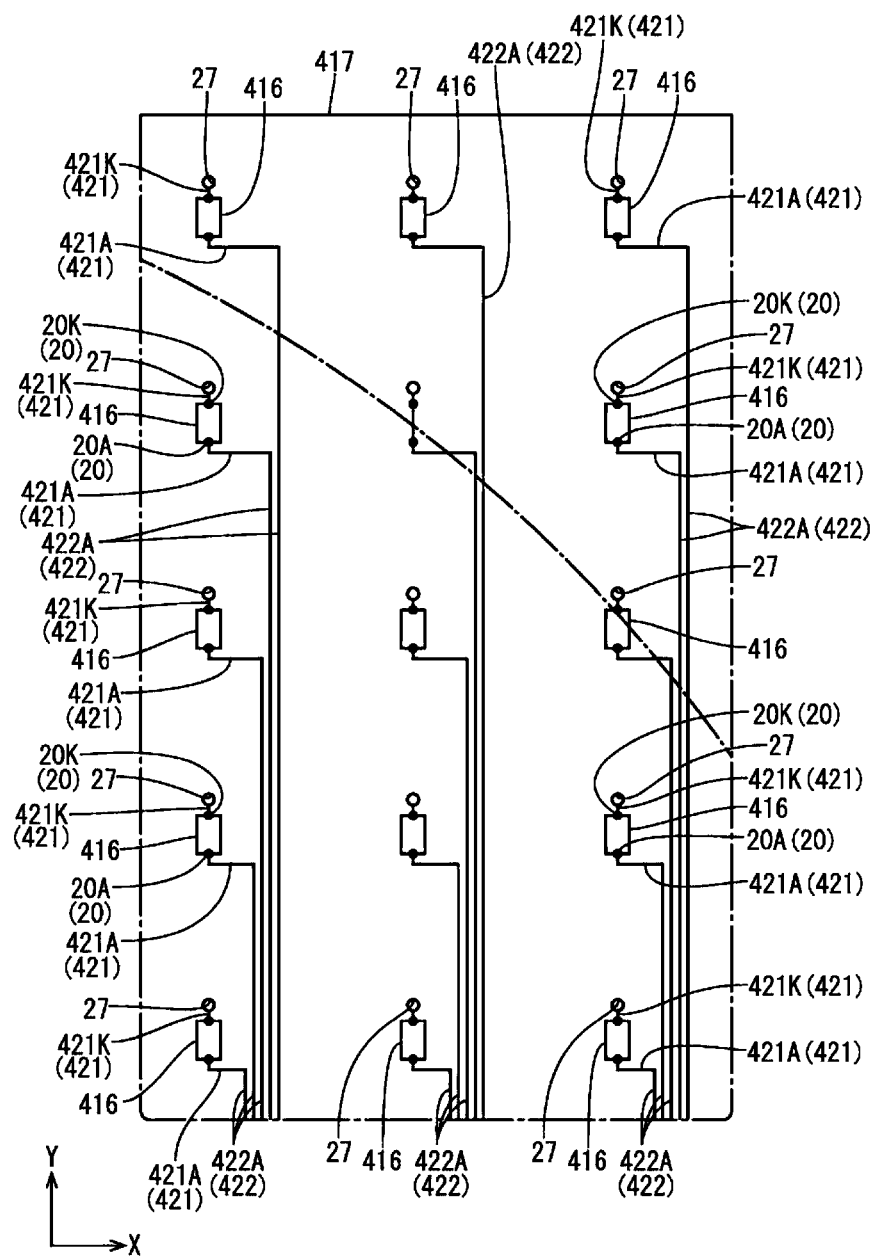
FIG. 16 is an enlarged plan view of a common LED substrate included in a backlight device according to Embodiment 5 of the invention.
Figure 17:
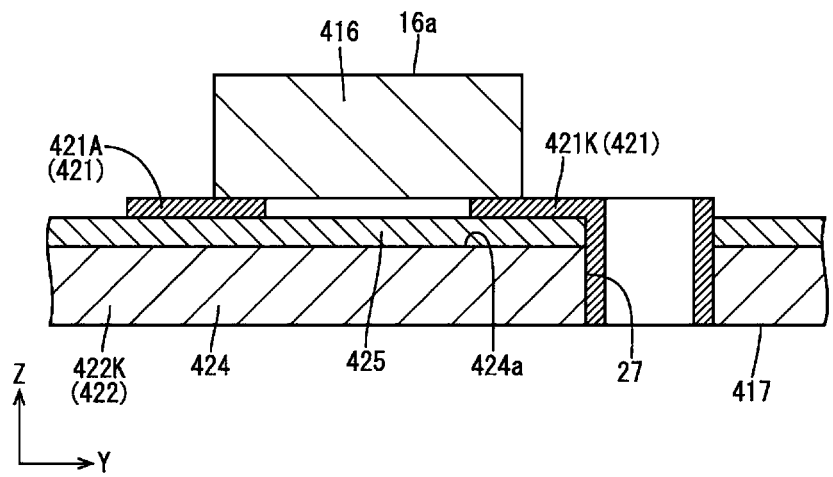
FIG. 17 is a sectional view of the common LED substrate.

As illustrated in FIGS. 16 and 17, an LED substrate 417 according to the present embodiment includes a cathode-side second wire 422K formed of the conductive substrate 424. In the conductive substrate 424, a through hole 27 is opened to be formed so as to penetrate in a plate thickness direction, and a part of a cathode-side first wire 421K that constitutes a first wire 421 is formed in the through hole 27. That is, the cathode-side first wire 421K is electrically connected to the conductive substrate 424 via the through hole 27, and the connected conductive substrate 424 itself constitutes the cathode-side second wire 422K. According to the aforementioned configuration, on an insulating layer 425 of the LED substrate 417, the first wire 421 and an anode-side second wire 422A may be arranged in the same layer, so that there is no need to provide the cathode-side second wire 422K as a wiring pattern in the same layer as that of the first wire 421 and the anode-side second wire 422A. Thereby, a degree of freedom in design of a wiring pattern in the LED substrate 417 is increased.

As described above, according to the present embodiment, the LED substrate 417 that includes the conductive substrate 424 on which a plurality of LEDs 416 are mounted and which is made of a conductive material, and the insulating layer 425 which is disposed on a side of a mounting surface 424a of the conductive substrate 424 for the LEDs 416 are provided, the first wire 421 is disposed on a surface on a side opposite to a side of the conductive substrate 424 in the insulating layer 425, an anode-side first wire 421A or the cathode-side first wire 421K is connected to the conductive substrate 424 via the through hole 27 that is opened to be formed in the conductive substrate 424, and one of the anode-side second wire 422A and the cathode-side second wire 422K is formed of the conductive substrate 424. In this manner, the insulating layer 425 is disposed so as to be interposed between the first wire 421 and the conductive substrate 424, so that short circuit therebetween is prevented. The anode-side first wire 421A or the cathode-aide first wire 421K that constitutes the first wire 421 is connected to the conductive substrate 424 that is one of the anode-side second wire 422A and the cathode-side second wire 422K via the through hole 27 that is opened to be formed in the conductive substrate 424, so that power supply to the LEDs 416 is performed. One of the anode-side second wire 422A and the cathode-side second wire 422K is formed of the conductive substrate 424, so that the other one of the anode-side second wire 422A and the cathode-side second wire 422K may be provided in the same layer as that of the first wire 421 and there is no need to provide the one. Thereby, a degree of freedom in design of a wiring pattern in the LED substrate 417 is increased.

Embodiment 6

Embodiment 6 of the invention will be described with reference to FIG. 18. Embodiment 6 indicates one in which a configuration of an insulating substrate 519 is changed from that of Embodiment 1 described above. Note that, duplicate description of a structure, an action, and an effect similar to those of Embodiment 1 described above will be omitted.

Figure 18:
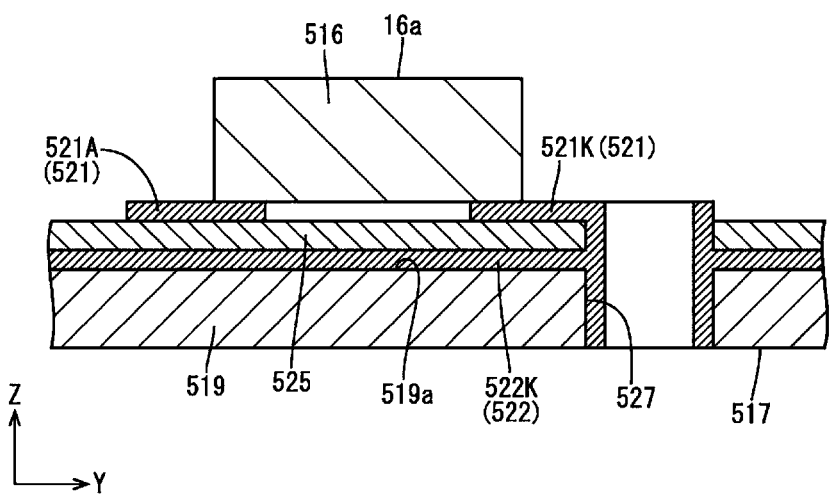
FIG. 18 is a sectional view of a common LED substrate included in a backlight device according to Embodiment 6 of the invention.

As illustrated in FIG. 18, an LED substrate 517 according to the present embodiment includes an insulating layer 525 that is disposed on a side of a mounting surface 519a of the insulating substrate 519 for LEDs 516. A first wire 521 and an anode-side second wire (not illustrated in the present embodiment) are disposed on a surface on a side opposite to a side of the insulating substrate 519 in the insulating layer 525. On the other hand, a cathode-side second wire 522K is disposed so as to be interposed between the insulating substrate 519 and the insulating layer 525. That is, the insulating layer 525 is interposed between the cathode-side second wire 522K, and the first wire 521 and the anode-side second wire, so that short circuit therebetween is prevented. In the insulating substrate 519, a through 527 is opened to be formed so as to penetrate in a plate thickness direction, and a part of a cathode-side first wire 521K that constitutes the first wire 521 is formed in the through hole 527. Then, a portion of the cathode-side first wire 521K, which is disposed in the through 527, is electrically connected to the cathode-side second wire 522K that is interposed between the insulating substrate 519 and the insulating layer 525. According to the aforementioned configuration, on the insulating layer 525 of the LED substrate 517, the first wire 521 and the anode-side second wire may be arranged in the same layer, so that there is no need to provide the cathode-side second wire 522K as a wiring pattern in the same layer as that cf the first wire 521 and the anode-side second wire. Thereby, a degree of freedom in design a wiring pattern in the LED substrate 517 is increased.

As described above, according to the present embodiment, the LED substrate 517 that includes the insulating substrate on which the plurality of LEDs 516 are mounted and which is made of an insulating material and the insulating layer 525 which is disposed on the side of a mounting surface 519a of the insulating substrate 519 for the LEDs 516 is provided, the first wire 521 is disposed on the surface on the side opposite to the side of she insulating substrate 519 in the insulating layer 525, and one of the anode-side second wire and the cathode-side second wire 522K is disposed in a form being interposed between the insulating substrate 519 and the insulating layer 525 and is connected to an anode-side first wire 521A or the cathode-side first wire 521K via the through hole 527 that is opened to be formed in the insulating substrate 519. In this manner, the insulating layer 525 is disposed so as to be interposed between the first wire 521 and the one of the anode-side second wire and the cathode-side second wire 522K, so that short circuit therebetween is prevented. The anode-side first, wire 521A or the cathode-side first wire 521K that constitutes the first wire 521 is connected to one of the anode-side second wire and the cathode-side second wire 522K via the through hole 527 that is opened to be formed in the insulating substrate 519, so that power supply to the LEDs 516 is performed. One of the anode-side second wire and the cathode-side second wire 522K is disposed so as to be interposed between the insulating substrate 519 and the insulating layer 525, so that the other one of the anode-side second wire and the cathode-side second wire 522K may be provided in the same layer as that of the first wire 521 and there is no need to provide the one. Thereby, a degree of freedom in design of a wiring pattern in the LED substrate 517 is increased.

Embodiment 7

Embodiment 7 of the invention will be described with reference to FIG. 19. Embodiment 7 indicates one in which arrangement of a cathode-side second wire 622K is changed from that of Embodiment 6 described above. Note that, duplicate description of a structure, an action, and an effect similar to those of Embodiment 6 described above will be omitted.

Figure 19:
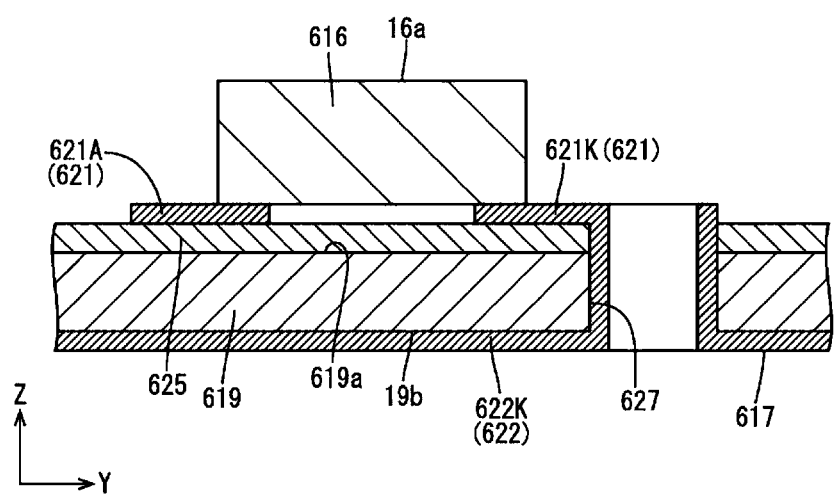
FIG. 19 is a sectional view of a common LED substrate included in a backlight device according to Embodiment 7 of the invention.

As illustrated in FIG. 19, in an LED substrate 617 according to the present embodiment, the cathode-side second wire 622K is disposed on a mounting-side opposite surface 19b on a side opposite to a mounting surface 619a of an insulating substrate 619 of the LED substrate 617. In the insulating substrate 619, a through hole 627 is opened to be formed so as to penetrate in a plate thickness direction, and a part of a cathode-side first wire 621K that constitutes a first wire 621 is formed in the through hole 627. Then, a portion of the cathode-side first wire 621K, which is disposed in the through hole 627, is electrically connected to the cathode-side second wire 622K that is disposed on the mounting-side opposite surface 19b in the insulating substrate 619. According to the aforementioned configuration, on an insulating layer 625 of the LED substrate 617, the first wire 621 and an anode-side second wire may be arranged in the same layer, so that there is no need to provide the cathode-side second wire 622K as a wiring pattern in the same layer as that of the first wire 621 and the anode-side second wire. Thereby, a degree of freedom in design of a wiring pattern in the LED substrate 617 is increased.

As described above, according to the present embodiment, the LED substrate 617 on which a plurality of LEDs 616 are mounted and which is made of an insulating material is provided, the first wire 621 is disposed on the mounting surface 619a of the LED substrate 617 for the LEDs 616, and one of the anode-side second wire and the cathode-side second wire 622K is disposed on the mounting-side opposite surface 19b on the side opposite to the mounting surface 619a of the LED substrate 617 and is connected to an anode-side first wire 621A or the cathode-side first wire 621K via the through hole 627 that is opened to be formed in the LED substrate 617. In this manner, the LED substrate 617 that is made of an insulating material is disposed so as to be interposed between the first wire 621 and the one of the anode-side second wire and the cathode-side second wire 622K, so that short circuit therebetween is prevented. The anode-side first wire 621A or the cathode-side first wire 621K that constitutes the first wire 621 is connected to one of the anode-side second wire and the cathode-side second wire 622K via the through hole 627 that is opened to be formed in the insulating substrate 619, so that power supply to the LEDs 616 is performed. One of the anode-side second wire and the cathode-side second wire 622K is disposed on the mounting-side opposite surface 19b on the side opposite to the mounting surface 619a of the LED substrate 617, so that the other one of the anode-side second wire and the cathode-side second wire 622K may be provided in the same layer as that of the first wire 621 and there is no need to provide the one. Thereby, a degree of freedom in design of a wiring pattern in the LED substrate 617 is increased.

Other Embodiments

The invention is not limited to Embodiments described with the above-mentioned description and the drawings, and, for example, the following embodiments are also included in the technical scope of the invention.

Figure 20:
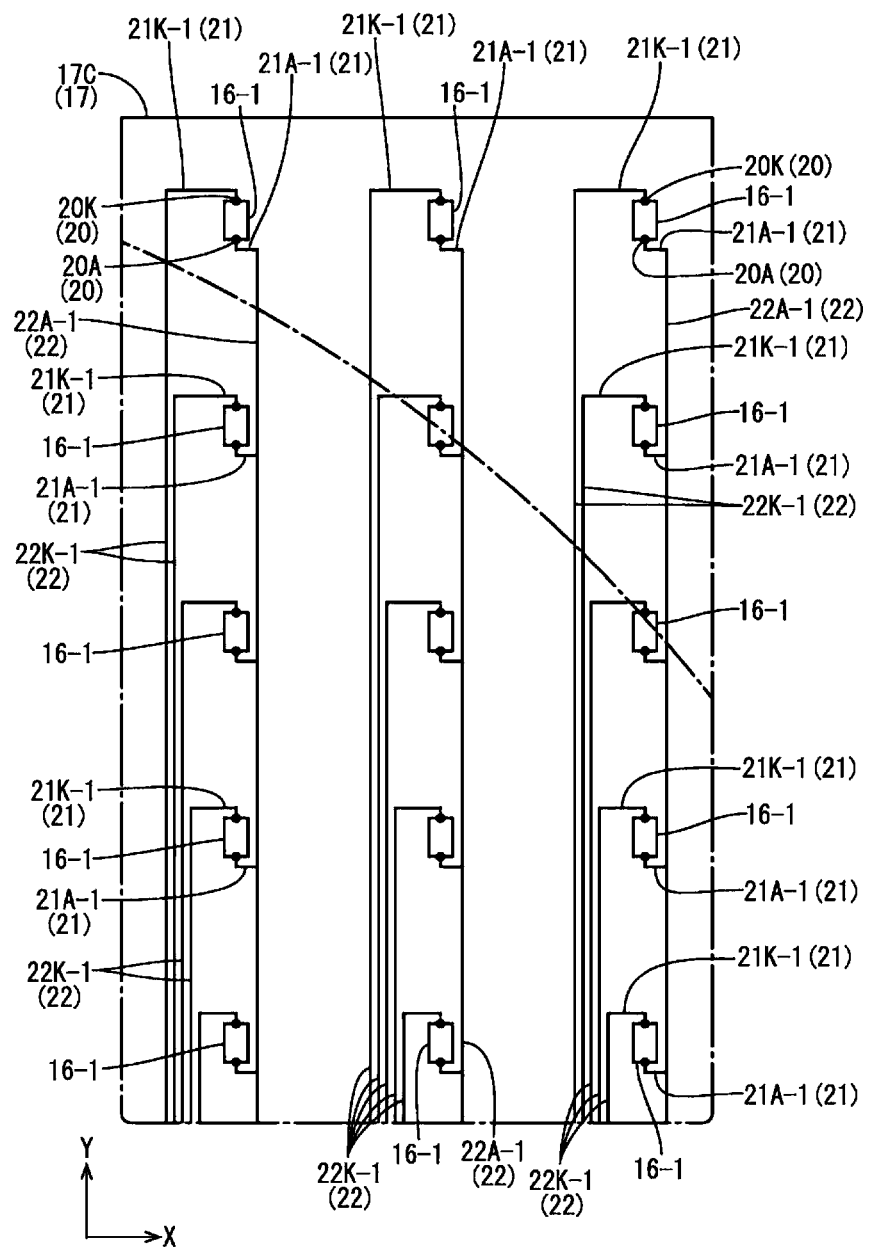
FIG. 20 is an enlarged plan view of a common LED substrate included in a backlight device according to another embodiment (1) of the invention.

(1) As a modified example 1 of each of Embodiments described above, as illustrated in FIG. 20, a configuration in which, whereas the number of anode-side second wires 22A-1 is set to be one, the number of cathode-side second wires 22K-1 is set to be the same as the number of LEDs 16-1 that form a column may be provided. In this case, all anode-side first wires 21A-1 the number of which is the same as the number of the plurality of LEDs 16-1 that form the column are collectively connected with the anode-side second wire 22A-1. On the other hand, cathode-side first wires 21K-1 the number of which is the same as the number of the plurality of LEDs 16-1 that form the column are individually connected with the cathode-side second wires 22K-1 the number of which is the same as the number of the plurality of LEDs 16-1 that form the column.

Figure 21:
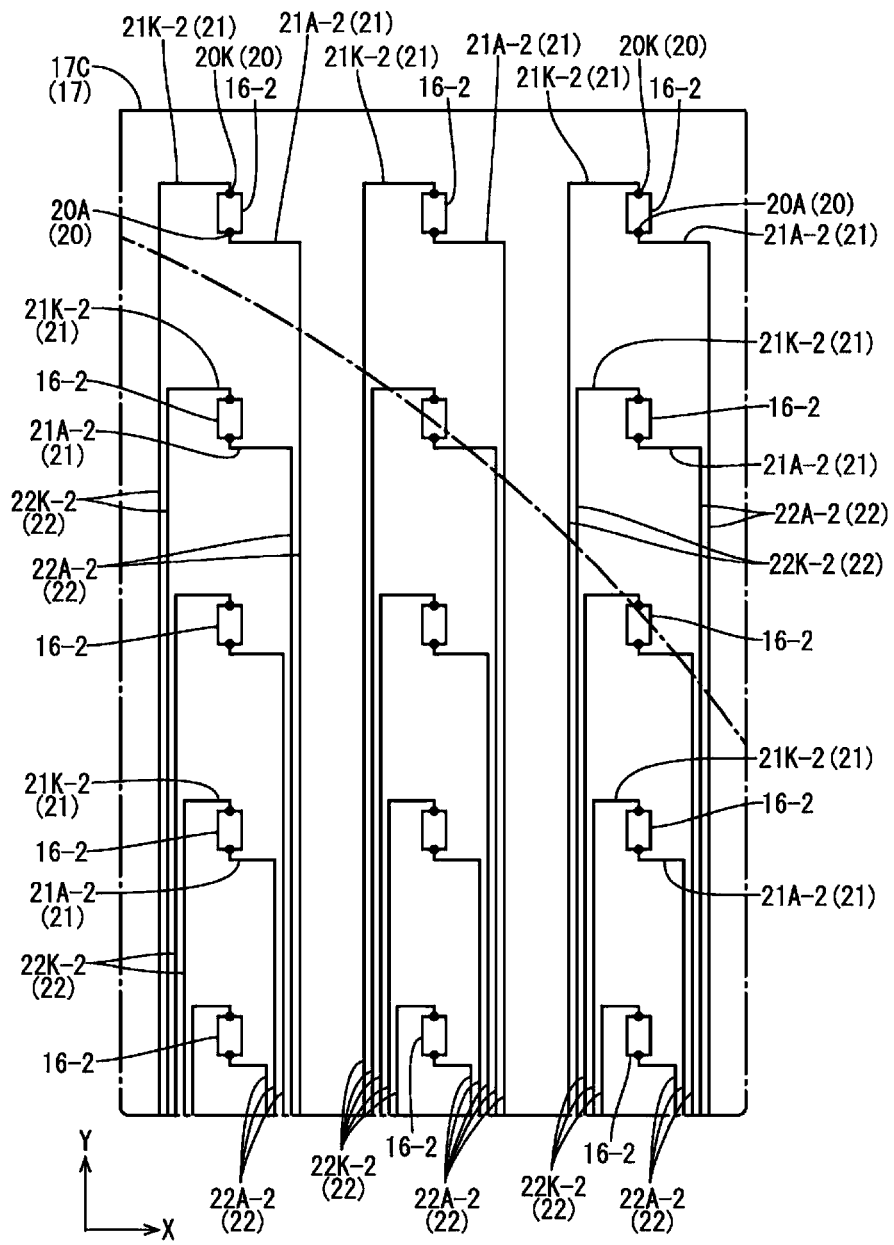
FIG. 21 is an enlarged plan view of a common LED substrate included in a backlight device according to another embodiment (2) of the invention.

(2) As a modified example 2 of each of Embodiments described above, as illustrated in FIG. 21, a configuration in which, each of the numbers of anode-side second wires 22A-2 and cathode-side second wires 22K-2 is set to be the same as the number of LEDs 16-2 that form a column may be provided. In this case, anode-side first wires 21A-2 and cathode-side first wires 21K-2 the number of each of which is the same as the number of the plurality of LEDs 16-2 that form the column are individually and respectively connected with the anode-side second wires 22A-2 and the cathode-side second wires 22K-2 the number of each of which is the same as the number of the plurality of LEDs 16-2 that form the column.

Figure 22:
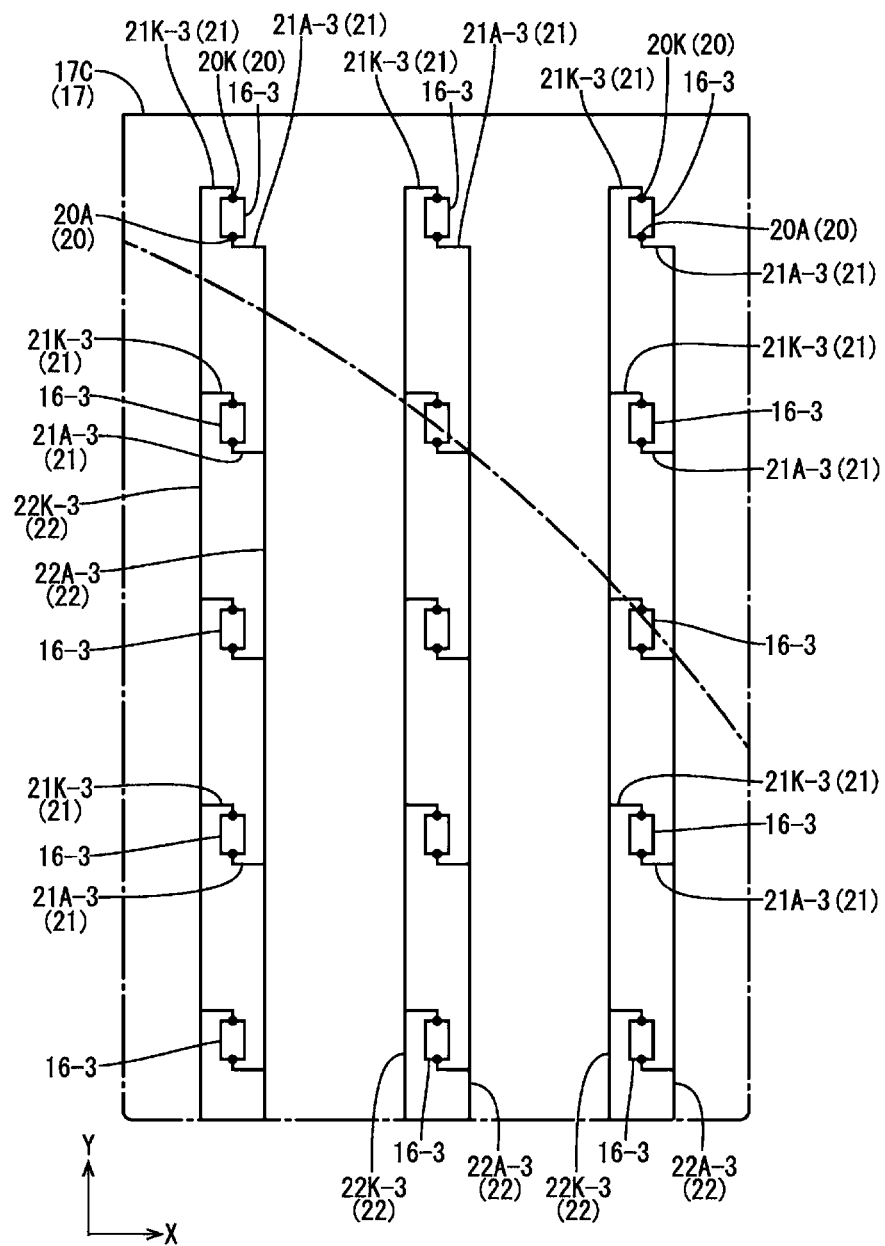
FIG. 22 is an enlarged plan view of a common LED substrate included in a backlight device according to another embodiment (3) of she invention.

(3) As a modified example 3 of each of Embodiments described above, as illustrated in FIG. 22, each of the numbers of anode-side second wires 22A-3 and cathode-side second wires 22K-3 is set to be one. In this case, all anode-side first wires 21A-3 and all cathode-side first wires 21K-3 the number of each of which is the same as the number of plurality of LEDs 16-3 that form a column are collectively and respectively connected with the anode-side second wires 22A-3 and the cathode-side second wires 22K-3. Accordingly, in the present modified example, an LED driving circuit serving as a power supply circuit that supplies power to each of the LEDs 16-3 is constituted as a parallel circuit.

(4) In Embodiment 2 described above, a case where the two LED substrates are used is described, but three or more LED substrates may be used.

(5) In Embodiment 3 described above, a case where laser processing is performed for the cathode-side second wire is described, but in a case where the number of anode-side second wires is set to be one as (1) described above, the laser processing may be performed for the anode-side second wire. Moreover, in a case where each of the numbers of anode-side second wires and cathode-side second wires is set to be one as (3) described above, the laser processing may be performed for both of the anode-side second wire and the cathode-side second wire.

(6) A combination of techniques described in Embodiments 3 and 4 described above may be used.

(7) In Embodiment 5 described above, a case where the cathode-side second wire is formed of the conductive substrate is described, but in the case where the number of anode-side second wires is set to be one as (1) described above, a configuration in which the anode-side second wire is formed of the conductive substrate may be adopted.

(8) In Embodiment 6 described above, a case where the cathode-side second wire is disposed so as to be interposed between the insulating substrate and the insulating layer is described, but in the case where the number of anode-side second wires is set to be one as (1) described above, a configuration in which the anode-side second wire is disposed so as to be interposed between the insulating substrate and the insulating layer may be adopted.

(9) In Embodiment 7 described above, a case where the cathode-side second wire is disposed on the mounting-side opposite surface in the insulating substrate is described, but in the case where the number of anode-side second wires is set to be one as (1) described above, a configuration in which the anode-side second wire is disposed on the mounting-side opposite surface in the insulating substrate may be adopted.

(10) In addition to each of Embodiments described above, the number of LEDs (the number of LEDs that constitute an LED column or the number of LED columns) that are mounted on the LED substrate, an arrangement interval, or the like may be appropriately changed.

(11) In addition to each of Embodiments described above, the planar shape of the liquid crystal display device may be a rectangular shape, a square shape, a round shape, an oval shape, an elliptical shape, or the like.

(12) in addition to each of Embodiments described above, the frame-like member may include a bottom supporting the LED substrate from the back side.

(13) In addition to each of Embodiments described above, a display panel that holds a functional organic molecule other than a liquid crystal material between a pair of substrates may be provided.

(14) In addition to each of Embodiments described above, the specific number, kinds, a lamination order, and the like of optical members used in the backlight device may be appropriately changed.

(15) In each of Embodiments described above, a TFT is used as a switching element of the liquid crystal display device, but the invention is also applicable to a liquid crystal display device using a switching element (for example, a thin film diode (TFL)) other than the TFT, and is also applicable to a liquid crystal display device performing black and white display other than a liquid crystal display device performing color display.

(16) In Embodiments described above, a liquid crystal panel is exemplified as the display panel, but the invention is also applicable to another type of display panel (such as a MEMS (Micro Electro Mechanical Systems) display panel).

REFERENCE SIGNS LIST

10 liquid crystal display device (display device), 11 liquid crystal panel (display panel), 12 backlight device (lighting device), 15 frame-like member, 15a light output unit, 16, 16-1, 16-2, 16-3, 216, 416, 516, 616 LET) (light source), 17, 117, 217, 317, 417, 517, 617 LED substrate (light source substrate), 19, 519, 619 insulating substrate, 19a, 519a, 619a mounting surface, 19b mounting-side opposite surface, 20 electrode, 20A anode electrode, 20K cathode electrode, 21, 421, 521, 621 first wire, 21A, 21A-1, 21A-2, 21A-3, 421A, 521A, 621A anode-side first wire, 21K, 21K-1, 21K-2, 21K-3, 221K, 421K, 521K, 621K cathode-side first wire, 22, 222, 322, 422, 522, 622 second wire, 22A, 22A-1, 22A-2, 22A-3, 222A, 422A anode-side second wire (the other side), 22K, 22K-1, 22K-2, 22K-3, 222K, 422K, 522K, 622K cathode-side second wire (one side), 23 LED driving circuit (power supply circuit), 24, 324, 424 conductive substrate, 24a, 424a mounting surface, 25, 325, 425, 525, 625 insulating layer, 26 insulating member, 27, 527, 627 through hole

The invention claimed is:

1. A lighting device comprising:
   a plurality of light sources that are arranged to form a column, each of which includes an electrode for power supply;
   a plurality of first wires that are connected to the electrode in the plurality of light sources;
   a second wire that is connected with each of the plurality of first wires and is pulled out toward one end side in an array direction of the plurality of light sources; and
   a light source substrate that includes an insulating substrate on which the plurality of light sources are mounted and which is made of an insulating material, and an insulating layer that is disposed on a side of a mounting surface of the insulating substrate for the light sources, wherein:
   in each of the light sources, the electrode includes an anode electrode and a cathode electrode, each of the first wires includes an anode-side first wire that is connected to the anode electrode and a cathode-side first wire that is connected to the cathode electrode, the second wire includes an anode-side second wire that is connected with each of a plurality of anode-side first wires, each of which is the anode-side first wire that is connected to the anode electrode, and a cathode-side second wire that is connected with each of a plurality of cathode-side first wires, each of which is the cathode-side first wire that is connected to the cathode electrode;
   at least one of a number of anode-side second wires and a number of cathode-side second wires is set to be one;
   whereas one of the number of the anode-side second wires and the number of the cathode-side second wires is set to be one, the other one of the numbers is set to be identical with the number of the light sources;
   the first wires are disposed on a surface of the insulating layer on a side opposite to a side of the insulating substrate; and
   the one of the anode-side second wire and the cathode-side second wire is disposed so as to be interposed between the insulating substrate and the insulating layer and is connected to the anode-side first wire or the cathode-side first wire via a through hole that is opened to be formed in the insulating substrate.

2. A lighting device comprising:
   a plurality of light sources that are arranged to form a column, each of which includes an electrode for power supply;
   a plurality of first wires that are connected to the electrode in the plurality of light sources;

a second wire that is connected with each of the plurality of first wires and is pulled out toward one end side in an array direction of the plurality of light sources; and a light source substrate on which the plurality of light sources are mounted and which is made of an insulating material, wherein:

in each of the light sources, the electrode includes an anode electrode and a cathode electrode, each of the first wires includes an anode-side first wire that is connected to the anode electrode and a cathode-side first wire that is connected to the cathode electrode, the second wire includes an anode-side second wire that is connected with each of a plurality of anode-side first wires, each of which is the anode-side first wire that is connected to the anode electrode, and a cathode-side second wire that is connected with each of a plurality of cathode-side first wires, each of which is the cathode-side first wire that is connected to the cathode electrode;

at least one of a number of anode-side second wires and a number of cathode-side second wires is set to be one;

whereas one of the number of the anode-side second wires and the number of the cathode-side second wires is set to be one, the other one of the numbers is set to be identical with the number of the light sources;

the first wires are disposed on a mounting surface of the light source substrate for the light sources; and the one of the anode-side second wire and the cathode-side second wire is disposed on a mounting-side opposite surface on a side opposite to the mounting surface of the light source substrate and is connected to the anode-side first wire or the cathode-side first wire via a through hole that is opened to be formed in the light source substrate.

3. A lighting device comprising:

a plurality of light sources that are arranged to form a column, each of which includes an electrode for power supply;

a plurality of first wires that are connected to the electrode in the plurality of light sources;

a second wire that is connected with each of the plurality of first wires and is pulled out toward one end side in an array direction of the plurality of light sources;

a light source substrate that includes a conductive substrate on which the plurality of light sources are mounted and which is made of a conductive material, and an insulating layer that is disposed on a side of a mounting surface of the conductive substrate for the light sources and is interposed at least between the second wire and the conductive substrate to insulate the second wire and the conductive substrate; and an insulating member that is attached to an end portion of the light source substrate on an other end side in the array direction and is disposed so as to cover at least a portion of the second wire, which is disposed on the end portion of the light source substrate on the other end side.

4. The lighting device according to claim 1, wherein:

the light source substrate on which the plurality of light sources are mounted so as to be arranged in matrix; and the lighting device further comprises a frame-like member that is formed into a frame shape so as to surround the plurality of light sources and includes a light output unit open toward a side opposite to a side of the light source substrate so as to output light.

5. A display device comprising:

the lighting device according to claim 1; and a display panel that displays an image by using light radiated from the lighting device.

* * * * *